(12) United States Patent
Ikarashi

(10) Patent No.: US 6,934,130 B2
(45) Date of Patent: Aug. 23, 2005

(54) MAGNETIC DEVICE HAVING SHAPED FERROMAGNETIC FILM

(75) Inventor: Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 153 days.

(21) Appl. No.: 10/233,959

(22) Filed: Sep. 2, 2002

(65) Prior Publication Data

US 2003/0107849 A1 Jun. 12, 2003

(30) Foreign Application Priority Data

Sep. 4, 2001 (JP) ........................................ 2001-266907

(51) Int. Cl.$^7$ ................................................ G11B 5/39
(52) U.S. Cl. ................................ 360/324.1; 360/324.2; 360/314
(58) Field of Search .......................... 360/324.1, 324.11, 360/324.12, 324.2, 313, 314, 325, 326, 327

(56) References Cited

U.S. PATENT DOCUMENTS

| | | | | |
|---|---|---|---|---|
| 5,654,854 A | * | 8/1997 | Mallary | 360/327.3 |
| 5,703,738 A | * | 12/1997 | Kim et al. | 360/327 |
| 6,075,360 A | * | 6/2000 | Mouchot et al. | 324/251 |
| 6,256,863 B1 | * | 7/2001 | Saito et al. | 29/603.08 |

* cited by examiner

Primary Examiner—Jefferson Evans
(74) Attorney, Agent, or Firm—Robert J. Depke; Trexler, Bushnell, Giangiorgi, Blackstone & Marr

(57) ABSTRACT

A unit element of a magnetic device or a ferroelectric device and magnetic particles of a magnetic recording medium are provided. The outline of the unit element and the magnetic particles is arranged so as to have a portion topologically identical to one of a letter-C shape and a letter-S shape that correspond to the magnetization or polarization distribution immediately before the rotation of magnetization or polarization.

11 Claims, 29 Drawing Sheets

PRIOR ART

US 6,934,130 B2

MAGNETIC DEVICE HAVING SHAPED FERROMAGNETIC FILM

This application claims priority to Japanese Patent Application Number JP200-266907 filed Sep. 4, 2001, which is incorporated herein by reference.

BACKGROUND OF THE INVENTION

1. Field of the Invention

The present invention relates generally to magnetic devices and magnetic recording media using ferromagnetic films and to devices employing ferroelectric films. The present invention is particularly directed to improvements on the dimensions of the elements and magnetic particles so as to achieve uniform coercive force and coercive field characteristics and to contribute to miniaturization of the devices.

2. Description of the Related Art

Various devices utilizing the giant magnetoresistive (GMR) effect and the tunneling magnetoresistive (TMR) effect have been known in the art. Examples of such devices include magnetic recording elements and magnetic read heads.

FIG. 1 shows a basic structure of a magnetic random access memory. An example of the magnetic random access memory can be found in Wang et al., IEEE Trans. Magn. 33 (1997), 4498. Referring to FIG. 1, the magnetic random access memory is basically constituted from memory elements which are either GMR elements or TMR elements, word lines, and bit lines, which also function as sense lines. The word lines are orthogonal to the bit lines, and the memory elements are held between the word lines and the bit lines at the intersections thereof. Note that in FIG. 1, reference symbol W denotes the width of each memory element in the direction parallel to the bit lines and reference symbol L denotes the length of each memory element in the direction parallel to the word lines.

Referring now to FIG. 2, a first end of the memory element is connected to the bit line, and a second end of the memory element is connected via a lead to a logic circuit that selects a memory cell. In the example shown in FIG. 2, a field effect transistor (FET) constituted from a silicon substrate, a drain D, a source S and a gate G is connected to the second end of the memory element via a plug (interconnecting lead). Note that FIG. 2 illustrates an example using a TMR element. The TMR element is constituted from a free layer composed of CoFe, NiFe, or the like, a barrier layer composed of $Al_2O_3$ or the like, a reference layer composed of CoFe or the like, a nonmagnetic layer composed of Ru or the like, a fixed layer composed of CoFe or the like, and an antiferromagnetic layer composed of PtMn or the like. These layers are arranged in that order when viewed from the bit line side. A GMR element has basically the same multilayer structure as that of the above-described TMR element and only differs from the TMR element in structural details such as the absence of barrier layer, etc.

The combination of the anisotropic magnetic field in the soft magnetic free layer and the demagnetization field determined by the size of the free layer defines the magnetic field necessary for rotating the magnetization direction of the free layer, i.e., the coercive force Hc.

FIG. 3 is an enlarged perspective view of the free layer, the reference layer, and the fixed layer of the memory element. In the drawing, the bold arrow in each layer indicates the magnetization direction of that layer. As shown in the drawing, the x axis extends along the long side of rectangular layers and the y axis extends orthogonal to the x axis. Reference symbol W denotes the width of the memory element in the y direction, and reference symbol L denotes the length of the memory element in the x direction. As shown in FIG. 3, easy axes of the free layer and the fixed layer are substantially parallel to each other. The magnetization direction of the reference layer is antiparallel to those of the free layer and the fixed layer.

The magnetization of the fixed layer is fixed by the antiferromagnetic layer. Given, for example, that bit information "1" is represented by the magnetization direction of the free layer being oriented in a direction parallel to the magnetization direction of the reference layer and that bit information "0" is represented by the magnetization direction of the free layer being oriented in a direction antiparallel to the magnetization direction of the reference layer, the magnetization direction of the free layer rotates due to the magnetic field, induced by a bit line current and a word line current, that exceeds the above-described coercive force Hc. Magnetic recording is performed through such a rotation.

FIGS. 4A to 4C illustrate example structures of shield-type magnetic read heads including read elements each disposed in the gap between a pair of shields (for example, refer to C. Tsang et al., IEEE Trans. Magn. 30 (1994), 3801). The shield-type magnetic read head includes a read element, namely, a GMR element or a TMR element, a lower shield S1, and an upper shield S2. In the drawings, hard magnet layers for controlling magnetic domains, disposed adjacent to the read element, a write head integrally formed above the read head, and so on are omitted for the sake of simplicity of explanation. The GMR or TMR heads shown in FIGS. 4A to 4C are classified into three types according to the direction of the sense current $I_s$. FIG. 4A illustrates, for example, a horizontal current-in-plane (CIP) GMR head in which an electric current flows in the track direction. FIG. 4B illustrates, for example, a vertical CIP GMR head in which an electric current flows in the height direction of the element. FIG. 4C illustrates, for example, a current-perpendicular-to-plane (CPP) GMR or TMR head in which a sense current $I_s$ flows in the thickness direction. The view of FIG. 4C is made partially transparent for the sake of simplicity of explanation. In the FIGS. 4A to 4C, arrows in strip-shaped recording media represent the recording magnetization direction.

FIG. 5 illustrates another example structure including a TMR element. The TMR element is constituted from a free layer, a barrier layer, a reference layer, a nonmagnetic layer, a fixed layer, and an antiferromagnetic layer arranged along the z axis in the drawing. In short, the TMR element in FIG. 5 has substantially the same layer structure as that shown in FIG. 2. However, in FIG. 5, hard magnets #1 and #2 are formed at the two sides of the TMR element, and the nonmagnetic layers NM are formed between the TMR element and the hard magnets #1 and #2. Hard magnet layers for controlling the magnetic domains must be disposed at the two sides of the TMR element to orient the magnetization direction of the free layer in the x axis direction.

FIG. 6 is an enlarged perspective view of the free layer, the reference layer, and the fixed layer of the above TMR element. The hard magnet layers for controlling the magnetic domains, a nonmagnetic layer, a base layer, and a protection layer are omitted from the drawing. In the drawing, a bold arrow in each layer indicates the magnetization direction of that layer. As shown in FIG. 6, the x axis extends along the long side of the rectangular layers and the y axis extends orthogonal to the x axis. Reference symbol W denotes the width of the element in the y direction, and reference symbol L denotes the length of the element in the x direction. As shown in FIG. 6, whereas the easy axis of the free layer extends substantially in the x-axis direction, the easy axes of the reference layer and the fixed layer are orthogonal to the easy axis of the free layer. The magnetization directions of the reference layer and the fixed layer are antiparallel to each other. The magnetization direction of the fixed layer is pinned by the antiferromagnetic layer.

FIGS. 7A and 7B are schematic plan views showing the shape of the above-described memory element and the read element. The memory element and read element are formed into a rectangular shape, as shown in FIG. 7A, or into an elliptic shape, as shown in FIG. 7B. In FIG. 7A, reference symbol W denotes the breadth of the element, and reference symbol L denotes the longitudinal length of the element. In FIG. 7B, reference symbol W denotes the length of the short axis and reference symbol L denotes the length of the long axis. In FIG. 7B, the element is formed into an elliptic shape to make the demagnetizing field as uniform as possible inside the element.

Known magnetic recording elements and magnetic read elements, however, suffer from the following technical bottlenecks:

(1) Since the variation in the coercive force Hc among magnetic memory elements is large, practical production of the magnetic memory element is difficult; and (2) For magnetic read elements, as the element size is reduced, a decrease in the sensitivity occurs due to the hard magnet layers for controlling magnetic domains, and thus magnetic read heads for higher-density media are difficult to design.

First, regarding point (1) above, in order to put magnetic random access memories having a storage capacity comparable to that of current widespread flash RAMs or DRAMs into practical use, all $10^6$ to $10^9$ magnetic memory elements must exhibit a uniform coercive force Hc. If the variation in Hc is 50% or more, the magnetization rotating current may differ by as much as 200% or more between some elements. In practice, this precludes selective recording.

As the size of magnetic memory elements decreases, the ratio of the demagnetizing field in coercive force Hc increases. Since the demagnetizing field is heavily dependent on the size and shape of the element, the variation in the coercive force Hc tends to increase in inverse proportion to the size of the elements. For the purpose of illustration, the dependency of the coercive force Hc on the element size was examined using a magnetic memory element having a free layer made of CoFe 2 nm in thickness. The results are shown in FIGS. 8 and 9.

In the graph of FIG. 8, characteristics of square and rectangular elements, i.e., box-shaped elements, as shown in FIG. 7A, when the aspect ratio W:L is varied are shown. The abscissa represents 1/W (unit: 1/μm), and the ordinate represents the coercive force Hc (unit: Oe=$10^3/4\pi$ A/m).

In the graph of FIG. 9, characteristics of elliptic elements, as shown in FIG. 7B, are shown. The aspect ratio W:L is varied. The abscissa and the ordinate are the same as in FIG. 8.

In these graphs of FIGS. 8 and 9, solid lines connecting circular symbols represent the characteristics of an element having an aspect ratio W:L=1:1, long dotted lines connecting square symbols represent the characteristics of an element having an aspect ratio W:L=1:2, and short dotted lines connecting rhombus symbols represent the characteristics of an element having an aspect ratio W:L=1:3. An inclined straight line extending from the origin represents the characteristic according to the theoretical formula: Hc=$2\pi$Ms(t/W), wherein Ms denotes the intensity of the magnetization, and t denotes the thickness.

As shown in these graphs, theoretically, the demagnetizing field is supposed to increase in inverse proportion to the length W of the short side of the element. However, this is not the case in practice. Particularly when the aspect ratio W:L is low, deviation from the theoretical value is significant. Since the number of the magnetic memory elements is large, as described above, it is preferred that the coercive force Hc be constant although some degree of variation in the aspect ratio may be observed.

Secondly, regarding point (2) above, in order to read higher-density recording media, the size of the read element installed in the magnetic read head must be reduced. Such a reduction in size increases the relative thickness of the domain walls at the ends of the free layer of the read element.

FIG. 10 is a graph showing the resistance/magnetic field characteristics of read elements each having a NiFe free layer with a track width L of 0.1 μm and 2 nm in thickness. No hard magnet layers for controlling the magnetic domains are provided for the read elements. The abscissa indicates the magnetic field (unit: Oe=$10^3/4\pi$ A/m) in the y axis direction in FIG. 6, and the ordinate indicates the resistance R (arbitrary units). In the graph, the solid lines connecting circular symbols represent the characteristics of read elements having an aspect ratio W:L=1:1, the long dotted lines connecting square symbols represent the characteristics of read elements having an aspect ratio W:L=1:2, and the short dotted lines connecting rhombus symbols represent the characteristic of read elements having an aspect ratio of 1:3.

As the thickness of the magnetic walls increases, hysteresis appears in the resistance/magnetic field curves of the read elements. In other words, when the aspect ratio is large, the curve around zero magnetic field is a straight line; however, the curve clearly exhibits hysteresis as the aspect ratio decreases.

The aspect ratio is preferably as small as is feasibly possible so as to read higher density media. However, read elements must maintain a particular magnetization state when no signals are provided and must respond linearly to an external magnetic field. In other words, read elements with a large coercive force Hc and hysteresis are not preferred. In order to eliminate hysteresis, hard magnet layers for controlling the magnetic domains are provided at the two sides of the element so as to forcibly orient the magnetization direction of the free layer in the track direction by the biasing magnetic field from these hard magnet layers. However, application of the biasing magnetic field from the hard magnet layers inhibits the rotation of the magnetization of the free layer, thereby drastically decreasing the sensitivity to the external magnetic field. In other words, small elements suffer from a decrease in the sensitivity because of the presence of the hard magnet layers.

As for the problem of point (1) above, defect-free bulk memories can be manufactured by making the coercive force Hc uniform over all the elements. In contrast, as for the problem of point (2) above, the coercive force Hc needs to be eliminated so as to decrease the biasing magnetic field of the hard magnet layers as much as possible and to manufacture magnetic read heads having high sensitivity. In other words, the object in point (1) is to maintain the coercive force Hc in the hysteresis curve in the easy axis direction of the free layer at a particular level; and the object in point (2) is to reduce the coercive force to zero in the hysteresis curve in the hard axis direction of the free layer. These objects appear contradictory but can be achieved simultaneously if the magnetization of the free layer can rotate simultaneously. The means for achieving these objects is the same.

The dependency of the coercive force characteristic on the size and shape of the element can be confirmed through investigation of the magnetization distribution immediately before rotation.

FIGS. 11A, 11B, 12A, and 12B show example magnetization distributions immediately before the rotation of the magnetization. The distributions are estimated by carrying out a micromagnetics simulation. FIGS. 11A and 11B show the distributions in rectangular elements, and FIGS. 12A and 12B show the distributions in elliptic elements. In the drawings, arrows inside the frames represent magnetization distributions, and streamlines above the frames schematically illustrate the general directions of the magnetization.

A large rectangular element of, for example, $1/W=1.5$ $\mu m^{-1}$, has a vortex distribution, as shown in FIG. 11A. A small rectangular element of, for example, $1/W=3.0$ $\mu m^{-1}$, has a distribution resembling the shape of letter S (hereinafter, the "S distribution"), as shown in FIG. 11B.

A large elliptic element of, for example, $1/W=1.5$ $\mu m^{-1}$, has a vortex distribution, as shown in FIG. 12A. A small elliptic element of, for example, $1/W=3.0$ $\mu m^{-1}$, has a distribution resembling the shape of letter C (hereinafter, the "C distribution"), as shown in FIG. 12B.

Note that the C and S distributions can be considered as a low-level buckling magnetic wall. Whereas buckling magnetic wall has many undulations, the number of undulations in the C and S distributions is low. The state of the magnetic wall in the element is determined according to the balance between the demagnetizing field energy, the anisotropic energy, the exchange coupling energy, and the Zeeman energy.

As the size of the element is reduced, the relative strength of the demagnetizing field energy increases, resulting in changes in magnetization distribution immediately before the rotation of the magnetization. Presumably, in most cases, the vortex distribution has a relatively large coercive force Hc, and the S and C distributions have a relatively small coercive force Hc.

It should be noted that the above description can be applied not only to devices using ferromagnetic layers but also to devices using ferroelectric layers. When applied to devices using ferroelectric layers, the demagnetizing field corresponds to the depolarization field, and the coercive force Hc corresponds to the coercive field Ec.

SUMMARY OF THE INVENTION

It is an object of the present invention to provide a micro device using a ferromagnetic or ferroelectric film that achieves uniformity in coercive force or coercive field.

To achieve this object, the outline of a unit element or magnetic particles that constitute the device is formed to have a portion topologically identical to a letter-C shape or a letter-S shape corresponding to the magnetization or polarization distribution immediately before the rotation.

The present invention specifies the boundary conditions of the outline of the unit element or magnetic particles so that the uniformity in magnetization distribution immediately before magnetization rotation and in polarization distribution immediately before polarization rotation can be achieved. In this manner, the magnetic or polarization distribution inside the unit element or the magnetic particles can be controlled, and uniformity in coercive force or coercive field can be achieved.

DESCRIPTION OF THE PREFERRED EMBODIMENTS

The present invention relates to devices and magnetic recording media using ferromagnetic films and to devices using ferroelectric films.

Examples of magnetic devices include: magnetic recording devices such as magnetic random access memories (RAMs) and recording devices using magnetic RAMs; and magnetic sensing devices such as read elements, read heads, magnetic read devices using read elements or read heads, sensing elements, magnetic field sensors, and magnetic sensing devices using sensing elements or magnetic sensors.

Each of these magnetic devices has a unit element that includes a ferromagnetic film. Examples of unit elements include memory elements, read elements, and magnetic sensing elements. The number of the unit elements used in a magnetic device can be any, but is generally large.

Figure 1:
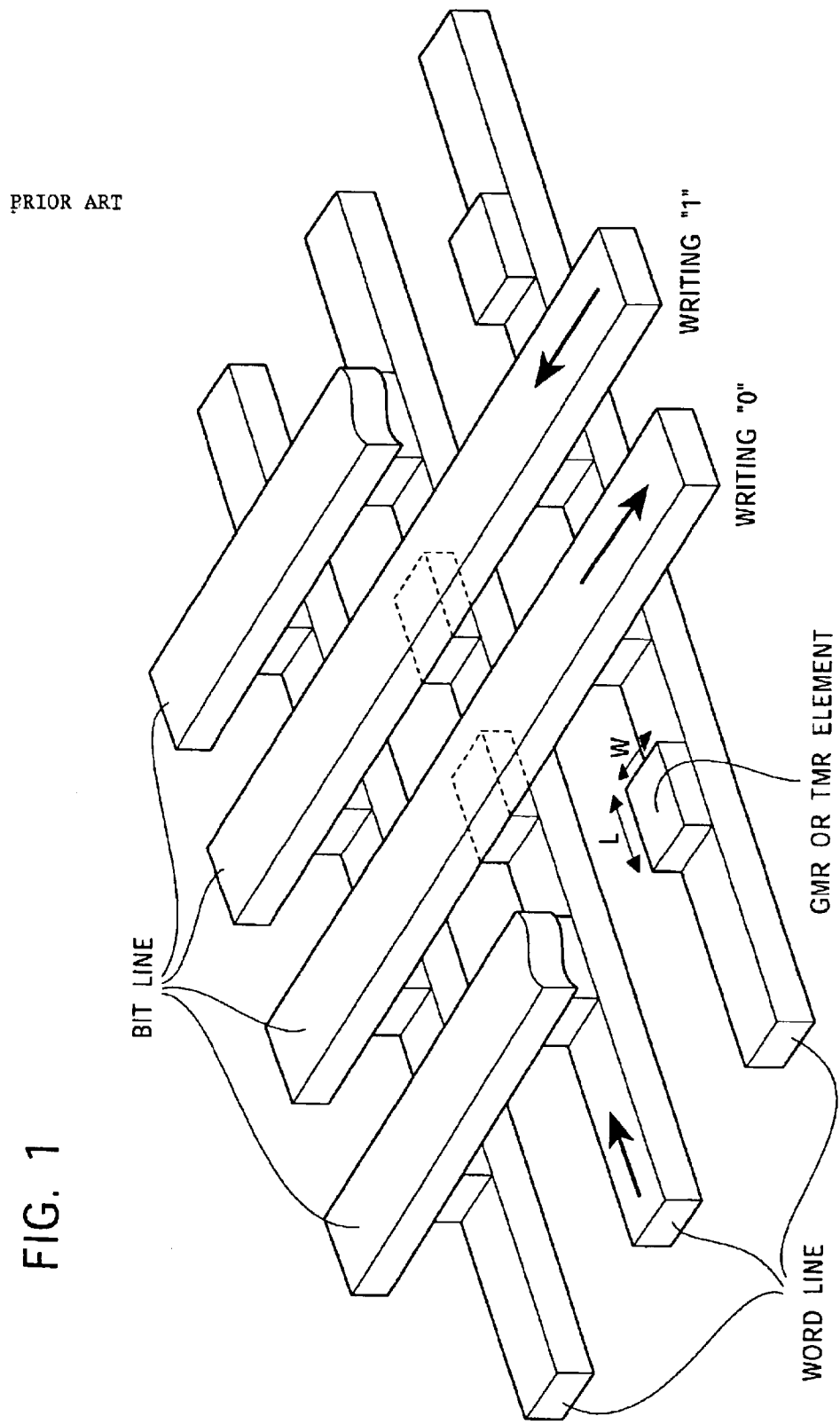
FIG. 1 is a perspective view of a magnetic random access memory.
Figure 2:
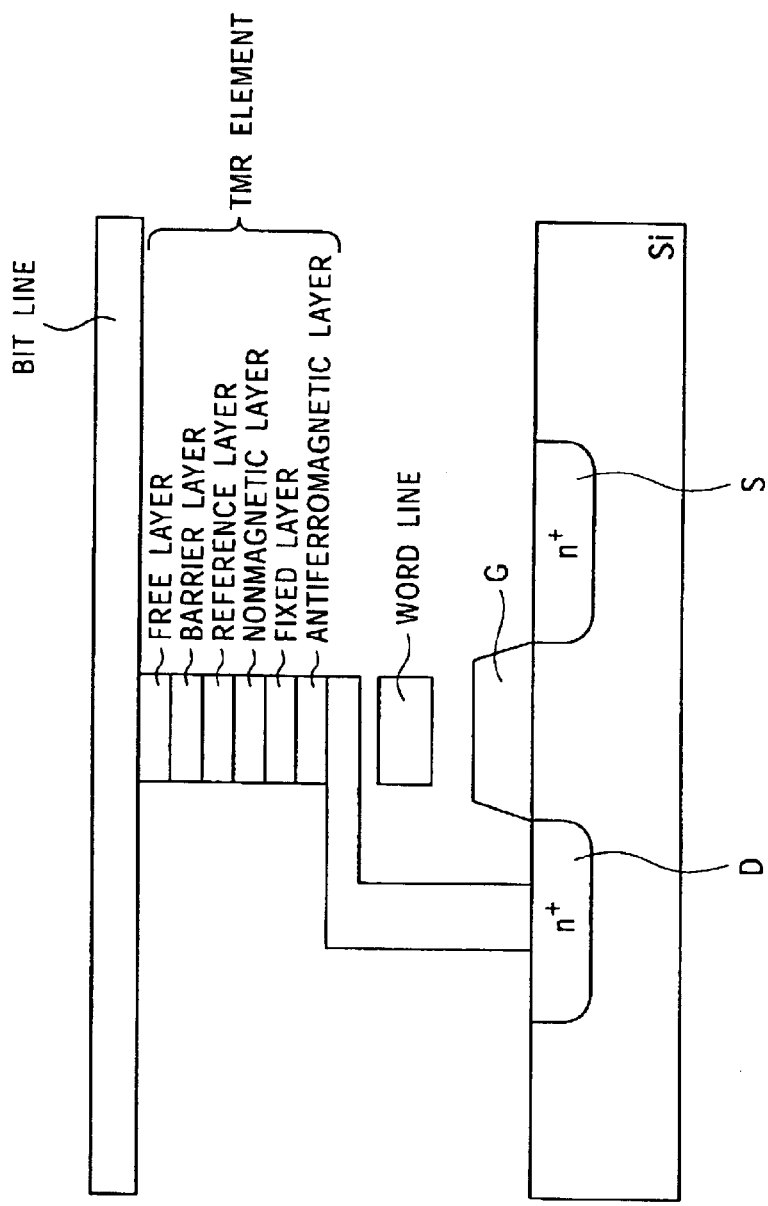
FIG. 2 is a schematic view of a tunneling magnetoresistive (TMR) element functioning as a memory element.

When the unit element is a memory element, e.g., a magnetic memory element shown in FIGS. 1 and 2, information is written on and read from the element discretely. However, the present invention is not limited to such a discrete form and can be applied to a continuous recording medium, as described below.

Moreover, the present invention can be applied to devices using ferroelectric films. Examples of unit elements of such devices include memory elements and capacitative elements.

In this specification, the embodiments of magnetic devices are described first, continuous recording media next, and ferroelectric devices last.

Figure 7A:
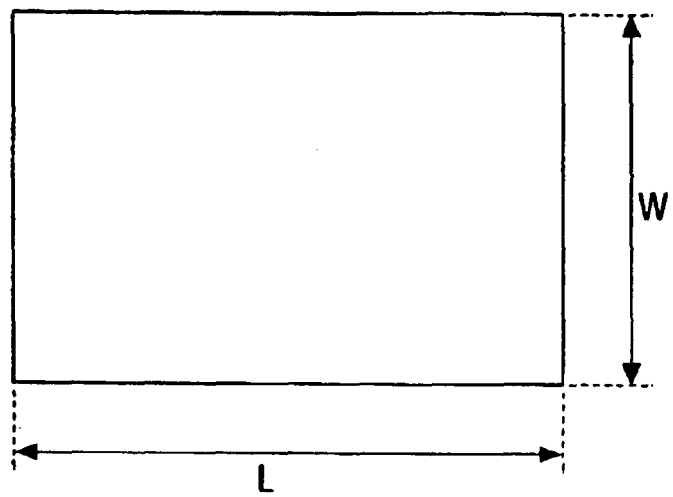
FIG. 7A is a plan view of a rectangular magnetic memory element or a rectangular read element and FIG. 7B is a plan view of an elliptic magnetic memory element or a elliptic read element.
Figure 7B:
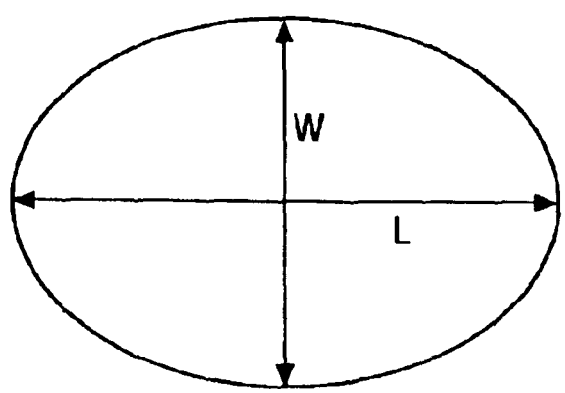
Figure 8:
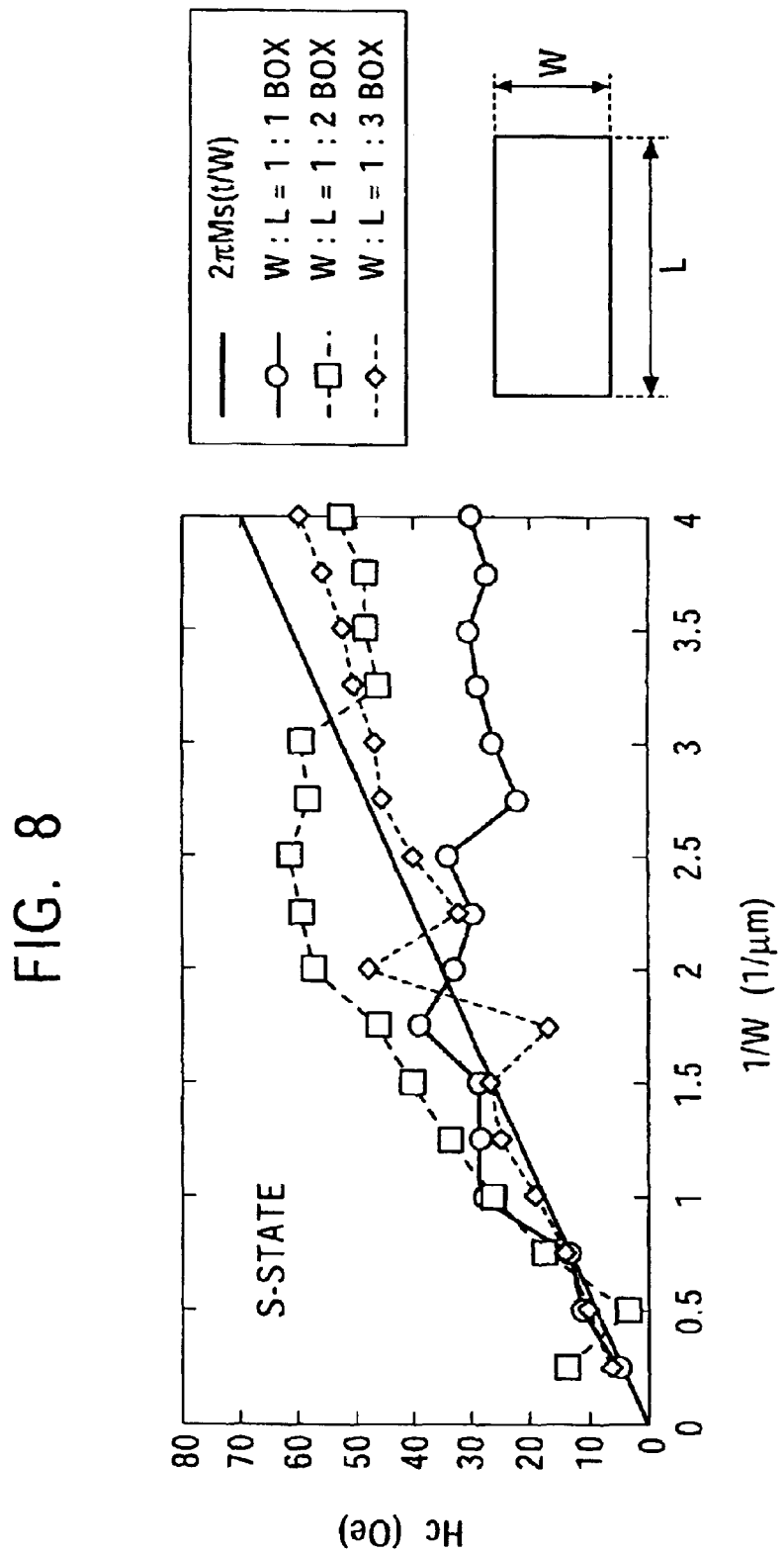
FIG. 8 is a graph showing the dependency of the coercive force on the size of box-shaped magnetic memory elements.
Figure 9:
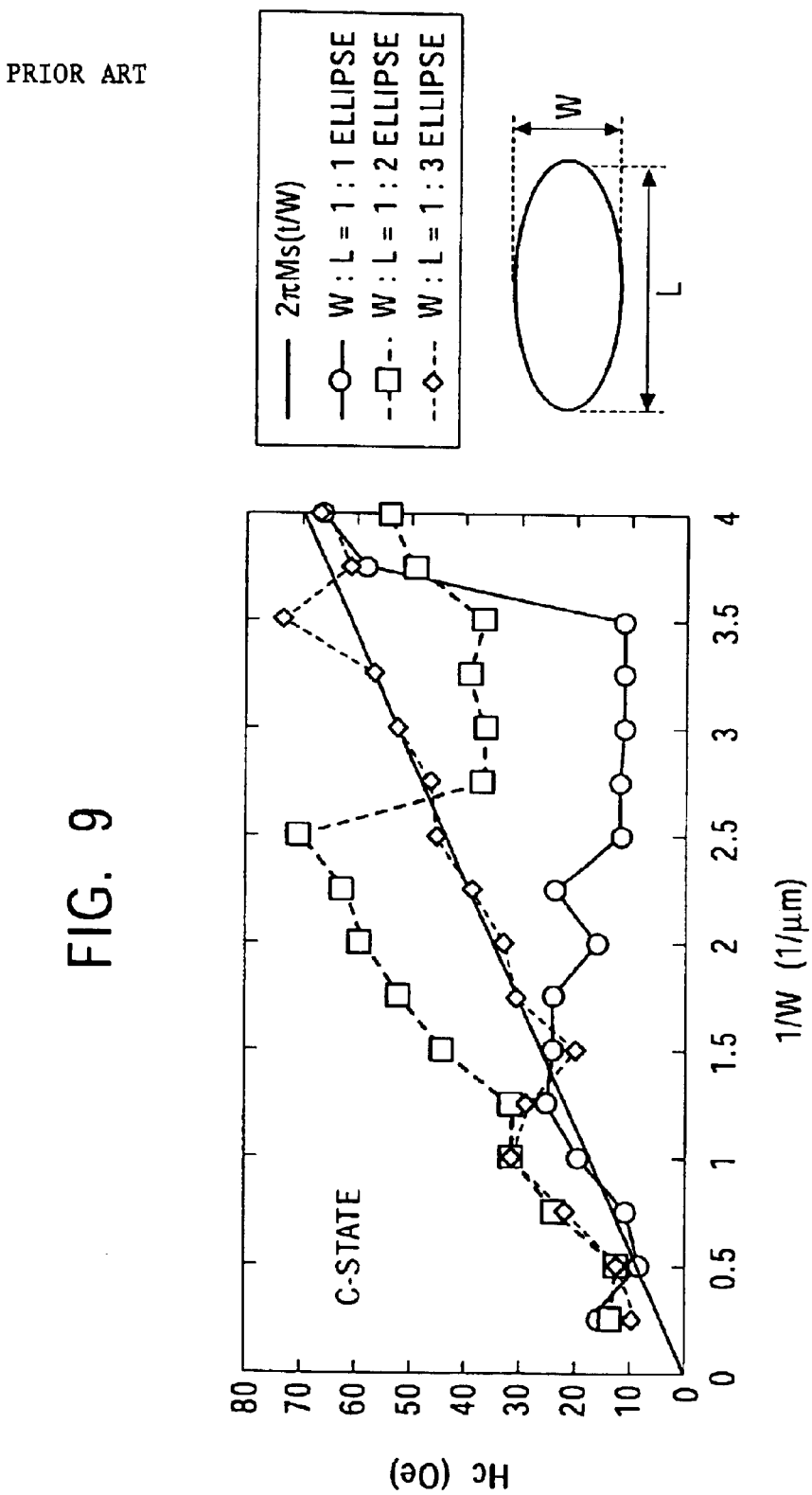
FIG. 9 is a graph showing the dependency of the coercive force on the size of elliptic magnetic memory elements.

In the above-described known box-shaped or elliptic elements, as shown in FIG. 7, the contribution of the demagnetizing field energy in the total magnetic energy varies. As a result, various magnetization distributions are observed immediately before the rotation of the magnetization, resulting in the variation in coercive force Hc. The shape of the element that can control the magnetization distribution immediately before the magnetization rotation needs to be specified to overcome the problem.

In other words, a variation in coercive force Hc can be substantially eliminated by making the magnetization distribution immediately before the magnetization rotation always the same. The boundary conditions of the element shape that can control the magnetization distribution inside the elements or magnetic particles must be specified.

On the other hand, the results of a magnetic distribution simulation of rectangular and elliptic elements show that the S distribution or the C distribution, i.e., a low-level buckling magnetic wall, appears as the size of the element is reduced.

Figure 11A:
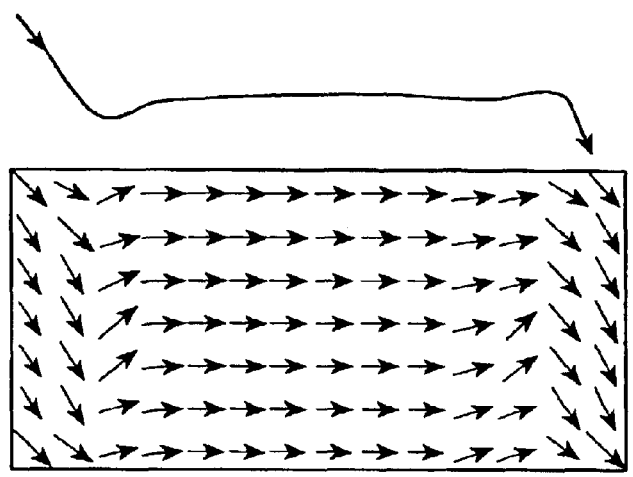
FIG. 11A shows the magnetization distribution of a large rectangular magnetic memory element immediately before rotation of the magnetization.
Figure 11B:
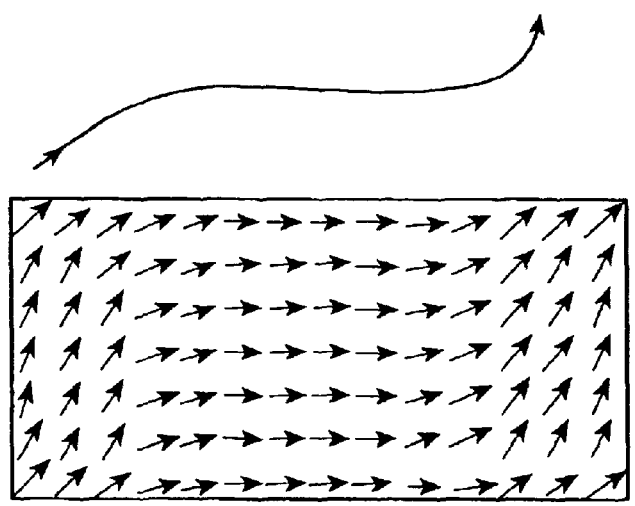
FIG. 11B shows the magnetization distribution of a small rectangular magnetic memory element immediately before rotation of the magnetization.
Figure 12A:
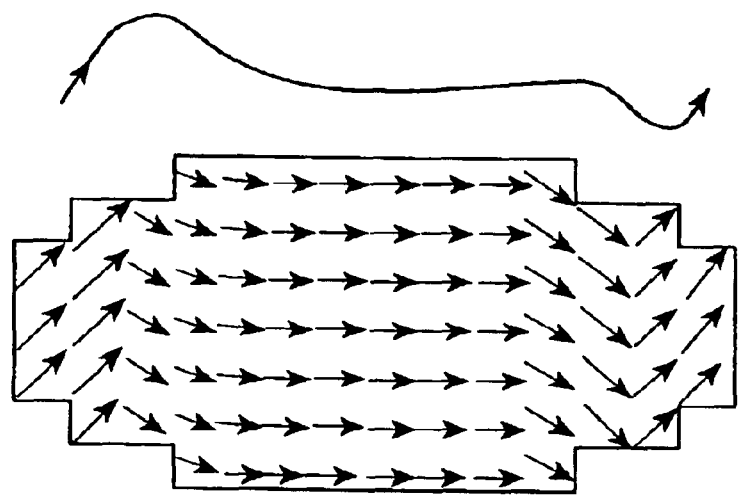
FIG. 12A shows the magnetization distribution of a large elliptic magnetic memory element immediately before rotation of the magnetization.
Figure 12B:
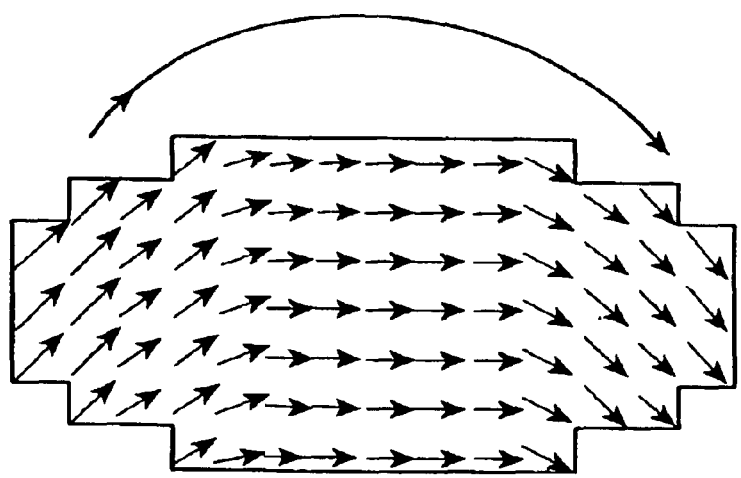
FIG. 12B shows the magnetization distribution of a small elliptic magnetic memory element immediately before rotation of the magnetization.

The vortex distributions, as shown in FIGS. 11A and 12A, are too complex to control by the shape of the element. However, the unit element can be formed to have a portion topologically identical to a desired C or S distribution so as to control the magnetization distribution immediately before the magnetization rotation.

In this specification, the language "topologically identical" means that a shape can be obtained from another shape by a topological transformation. For example, a sphere cannot be transformed into a torus, and a circle cannot be transformed into a horizontal cross-sectional shape of a torus, i.e., a doughnut shape.

Moreover, the magnetization distribution immediately before the rotation of magnetization can be effectively prevented from widely varying when the unit element is shaped so as not to have rotational symmetries with respect to the magnetization easy axis or hard axis. Since the above-described box shapes and elliptic shapes have a 180° rotational symmetry, elements having such shapes exhibit a wide variety of magnetization distribution before magnetization rotation and thus demonstrate a large variation in the coercive force Hc. This tendency is particularly acute in circular or square elements having high rotational symmetry. Thus, the elements preferably have portions topologically identical to the shape of letter C or letter S and are preferably asymmetrical.

Note that when the C distribution and the S distribution are compared, the S distribution is of a higher magnetization mode, i.e., has a higher total energy. This can be understood from that an S distribution is the combination of two C distributions. The lower the total energy, the more stable the elements are. Moreover, since the S distribution has poor compatibility to a biasing magnetic field working in a single direction, the C distribution is preferred to the S distribution.

Figure 3:
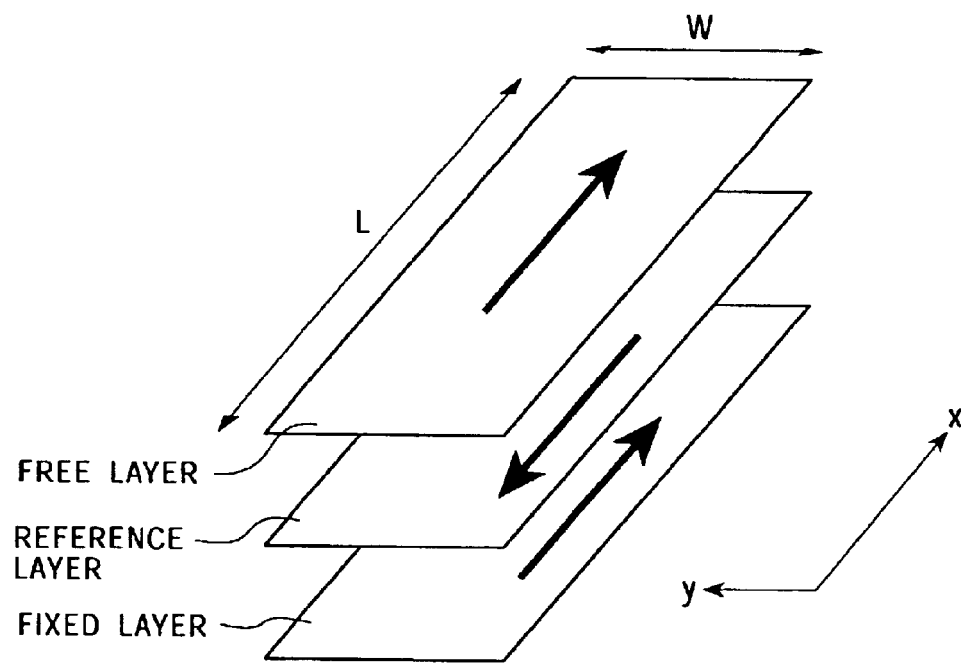
FIG. 3 is a schematic view of a free layer, a reference layer, and a fixed layer showing the structure of a rectangular magnetic element.
Figure 4A:
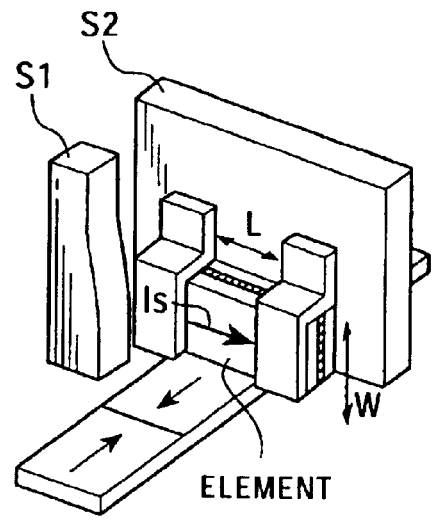
FIGS. 4A to 4C are perspective views showing example structures of shield-type magnetic heads incorporating read elements.
Figure 4B:
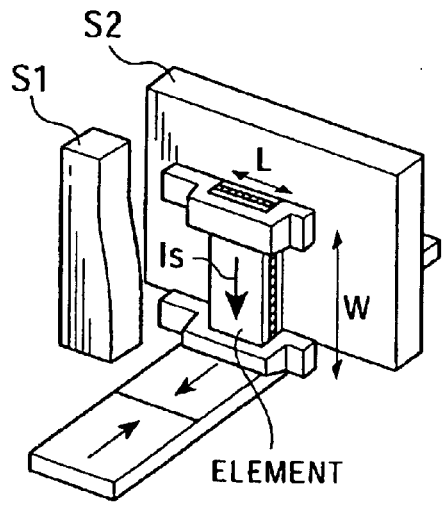
Figure 4C:
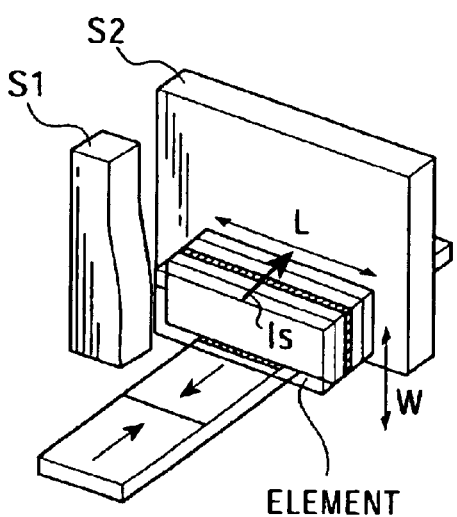
Figure 6:
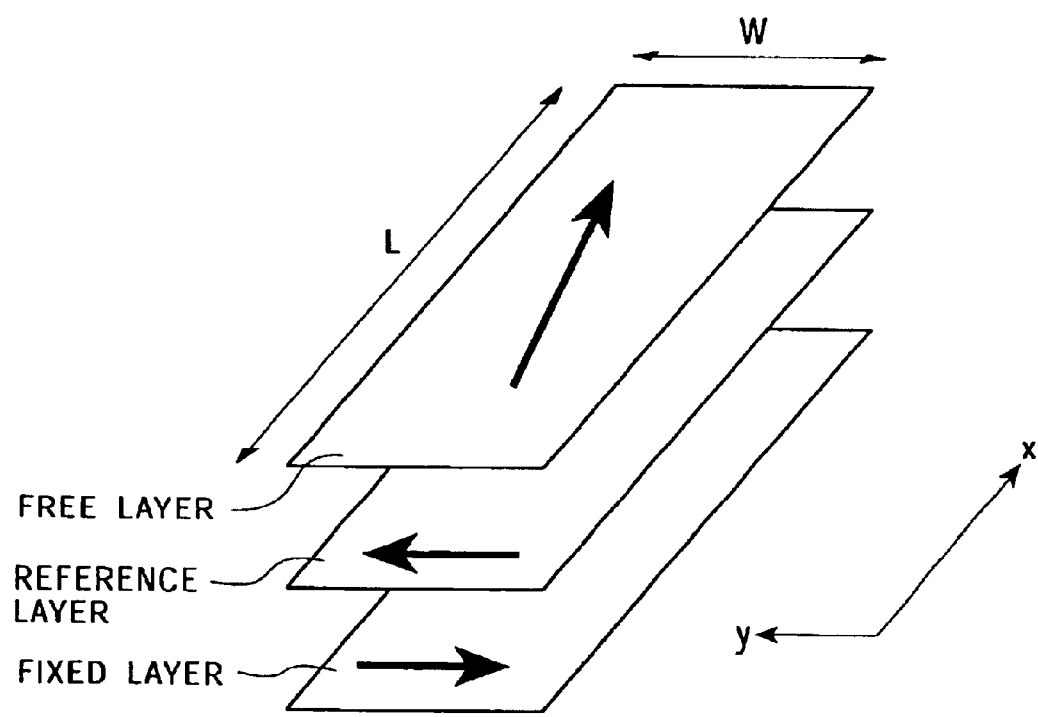
FIG. 6 is a schematic view of a free layer, a reference layer, and a fixed layer of a shield-type read element.
Figure 13:
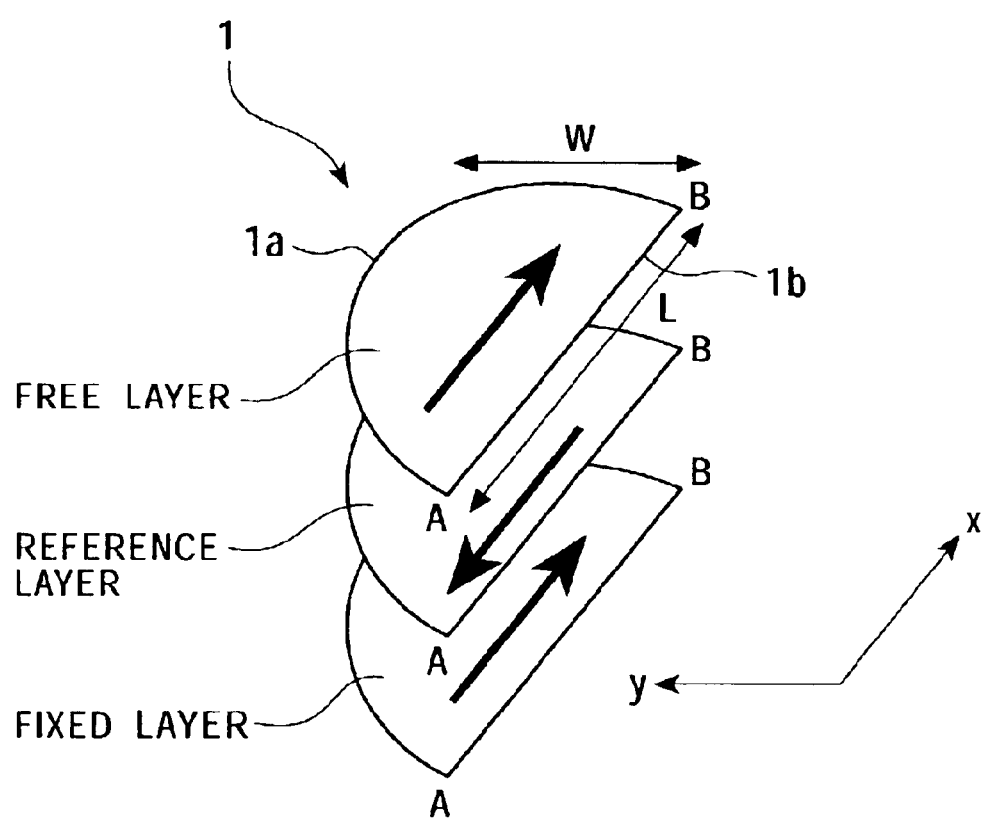
FIG. 13 shows the arrangement of a free layer, a reference layer, and a fixed layer of a semi-elliptic magnetic memory element according to the present invention.
Figure 14:
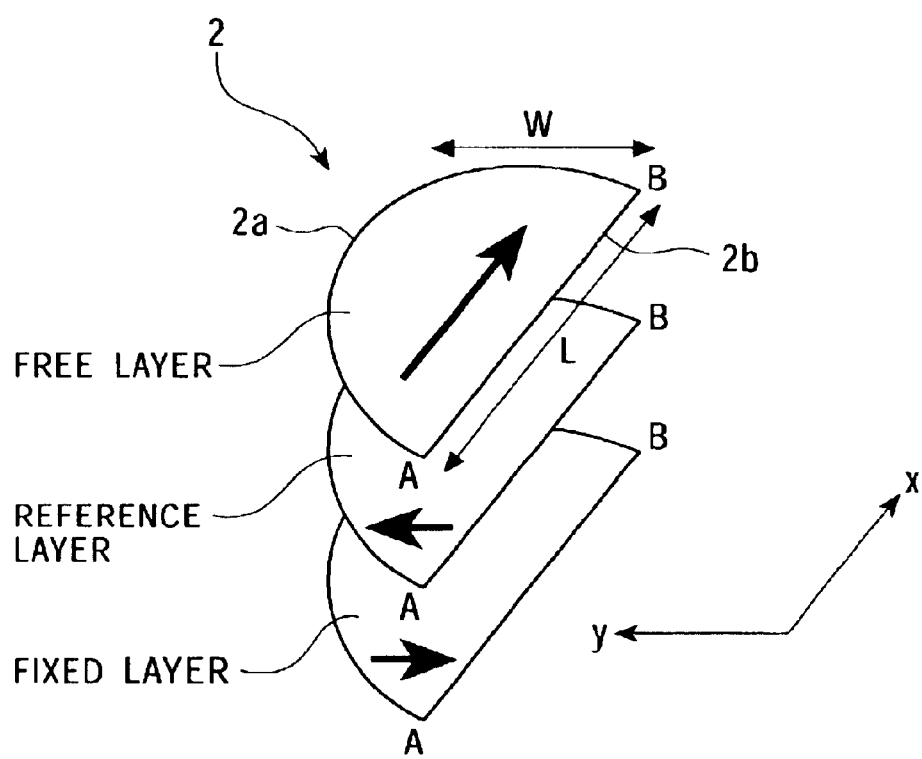
FIG. 14 shows the arrangement of a free layer, a reference layer, and a fixed layer of a semi-elliptic magnetic read element according to the present invention.

FIGS. 13 and 14 show example semi-elliptic elements having the outline including the shape of letter C. FIG. 13 shows an example of a magnetic memory element, and FIG. 14 shows an example of a read element. Note that in these drawings, only the free layer, the reference layer, and the fixed layers are depicted. FIGS. 13 and 14 correspond respectively to FIGS. 3 and 6 described above. Since the overall structure of the memory device and the read device have been described above with reference to FIGS. 1 and 4, only the essence of the invention is described below.

The bold arrows in FIG. 13 each represent the direction of the easy axis of the corresponding layer.

Referring to FIG. 13, the free layer, the reference layer, and the fixed layer have the same semi-elliptic shape. Using the free layer as an example, the outline of the layer consists of an arc portion 1a and a straight portion 1b. In other words, the outline of the semi-ellipse consists of two paths between the apexes A and B. The arc portion 1a is topologically identical to the above-described letter-C shape. The arc portion 1a enables the C distribution of the magnetization. The straight portion 1b allows concentration of positive and negative magnetic charges in the C magnetization distribution.

In FIG. 13, the x axis is parallel to the straight portion 1b, and the y axis is orthogonal to the x axis. Reference symbol L denotes the length of the element in the x axis direction, and reference symbol W denotes the length of the element in the y axis direction. As shown in the drawing, the easy axes of the free layer and the fixed layer are parallel to each other, and the easy axis of the reference layer is antiparallel to those of the free layer and the fixed layer.

Referring now to FIG. 14, the free layer, the reference layer, and the fixed layer of a read element 2 have easy axes represented by the corresponding bold arrows. The hard magnet layers for controlling magnetic domains, the non-magnetic layer, the base layer, and the protection layer are omitted for the purpose of simplification.

The read element 2 is also semi-elliptic when viewed from above the element. For example, the outline of the free layer consists of an arc portion 2a and a straight portion 2b. The arrangement of the x and y axes, the definitions of the reference characters W and L are substantially the same as in FIG. 13. However, the easy axis of the reference layer is parallel to the y axis, and the easy axis of the fixed layer is antiparallel to the y axis. In other words, the easy axes of the reference layer and the fixed layer are orthogonal to the easy axis of the free layer extending in the x-axis direction. The magnetization direction of the reference layer is antiparallel to that of the fixed layer, and the magnetization of the fixed layer is fixed by an antiferromagnetic layer (not shown in the drawing).

In the read element 2, the arc portion 2a, which is topologically identical to the above-described letter-C shape, enables the C distribution of the magnetization. The straight portion 2b allows concentration of positive and negative magnetic charges having the C magnetization distribution.

Figure 15:
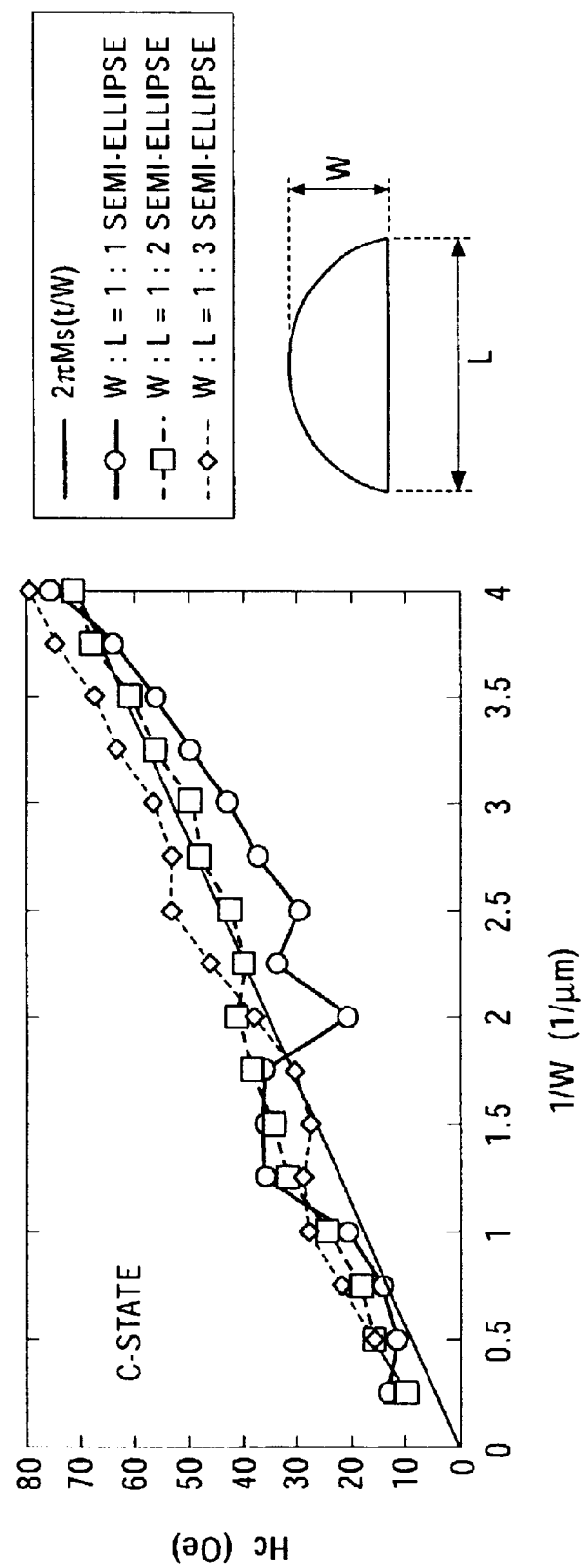
FIG. 15 is graph showing the dependency of the coercive force on the size of semi-elliptic magnetic memory elements of the present invention.

FIG. 15 is a graph showing the dependency of the coercive force Hc of the semi-elliptic magnetic memory element shown in FIG. 13 on the size of the element.

FIG. 15 shows the characteristic of the memory element 1 when the aspect ratio W:L is varied. The abscissa indicates 1/W (unit: 1 $\mu$m), and the ordinate indicates the coercive force Hc (unit: Oe=$10^3$/4$\pi$ A/m). A solid line connecting circular symbols represents the characteristic of an element having an aspect ratio W:L=1:1, a long dotted line connecting square symbols represent the characteristic of an element having an aspect ratio W:L=1:2, and a short dotted line connecting rhombus symbols represents the characteristic of an element having an aspect ratio W:L=1:3. An inclining straight line extending from the origin represents the theoretical characteristic according to a formula: Hc=2$\pi$Ms(t/W).

The graph shows that the coercive force increases in proportion to 1/W despite a change in aspect ratio and that the variation in coercive force Hc is significantly decreased. In the graph, the phrase "C-STATE" is inserted to indicate that the magnetization distribution immediately before is the C distribution.

Figure 16:
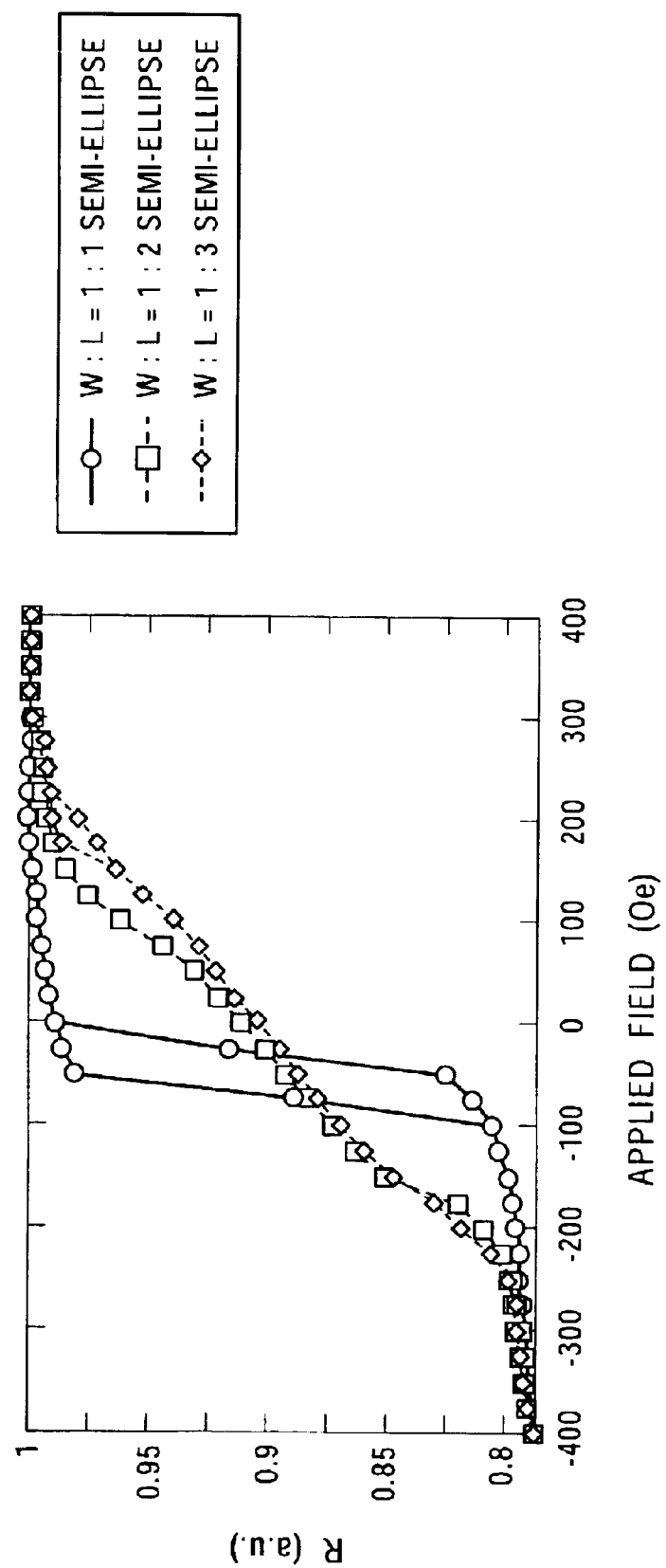
FIG. 16 is a graph showing the resistance/magnetic field characteristics of semi-elliptical magnetic memory elements of the present invention.

FIG. 16 shows resistance/magnetic field characteristics of read elements having a semi-elliptic shape as with the read element 2 described above. No hard magnet layers for controlling magnetic domains were provided to the read elements. The abscissa indicates the magnetic field (unit: Oe=$10^3$/4$\pi$ A/m) in the y axis direction in FIG. 14, and the ordinate indicates the resistance R (arbitrary units). In the graph, a solid line connecting circular symbols represents the characteristic of a read elements having an aspect ratio W:L=1:1, a long dotted line connecting square symbols represents the characteristic of a read element having an aspect ratio W:L=1:2, and a short dotted line connecting rhombus symbols represents the characteristic of a read element having an aspect ratio of 1:3.

Figure 10:
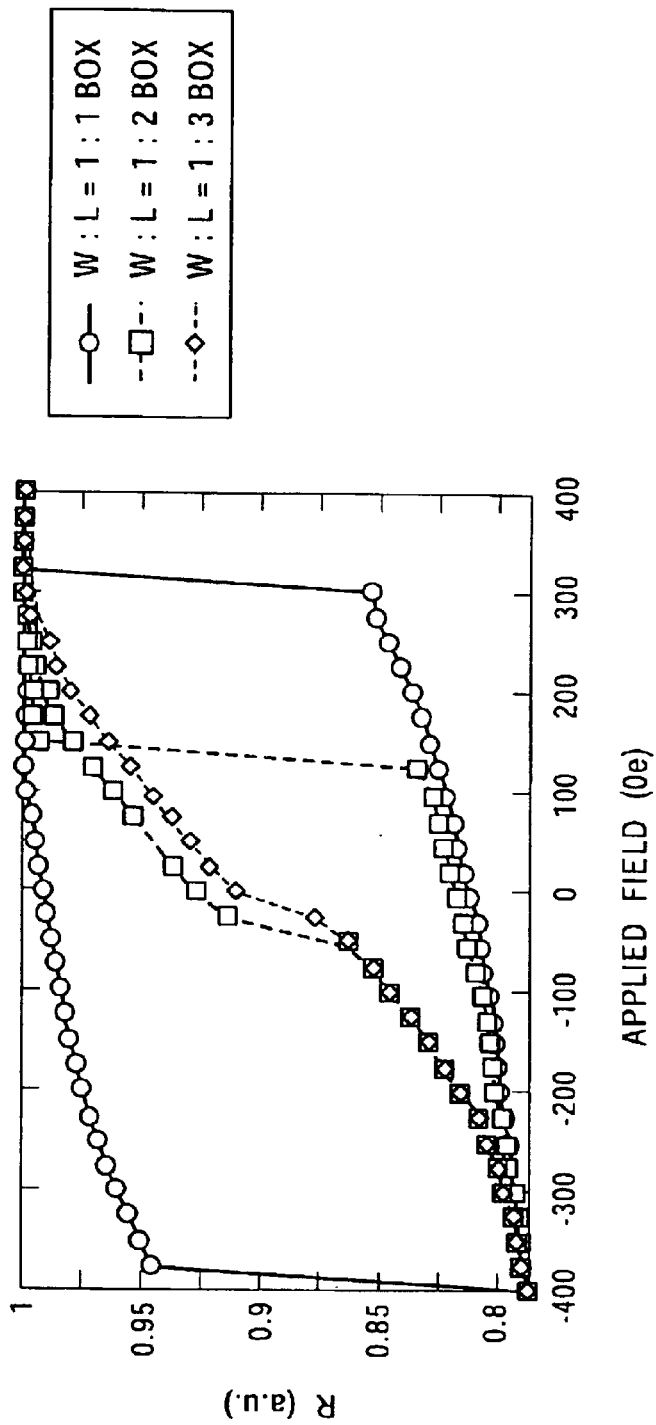
FIG. 10 is a graph showing the resistance/magnetic field characteristics of box-shaped magnetic memory elements.

FIG. 16 shows that an increase in coercive force Hc is gentle even when the aspect ratio is low. When the aspect ratio is larger than 1:1, the magnetization of the semi-elliptic element is presumably rotated simultaneously even when no biasing magnetic field is applied. FIG. 16 clearly shows that the hysteresis is suppressed, when compared with FIG. 10.

Figure 17A:
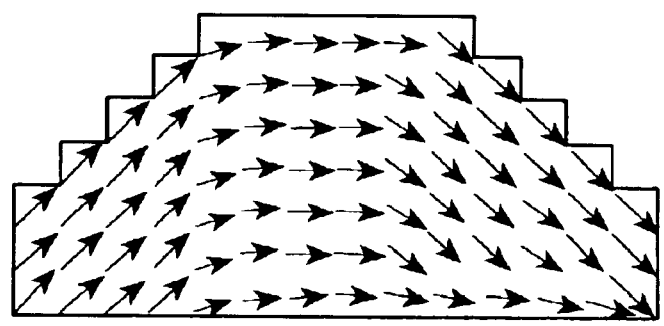
FIG. 17A shows the magnetization distribution of a large semi-elliptic magnetic memory element immediately before rotation of the magnetization according to the present invention.
Figure 17B:
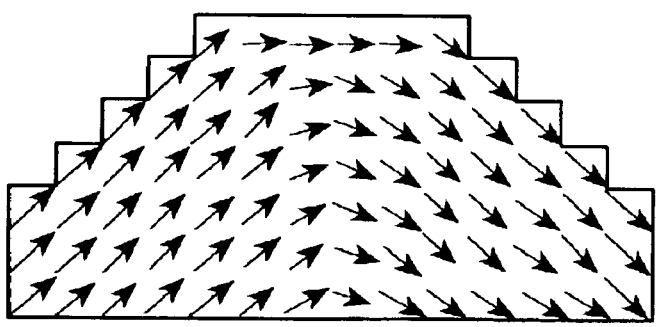
FIG. 17B shows the magnetization distribution of a small semi-elliptic magnetic memory element immediately before rotation of the magnetization according to the present invention.

FIGS. 17A and 17B show an example magnetic distribution immediately before the rotation of magnetization estimated by a micromagnetics simulation technique.

FIG. 17A shows a magnetic distribution of a large element of, for example, 1W=1.5 $\mu$m$^{-1}$. As shown in FIG. 17A, the element exhibits the C distribution. FIG. 17B shows a magnetic distribution of a small element of, for example, 1/W=3.0 $\mu$m$^{-1}$. As shown in FIG. 17B, the element exhibits the C distribution. This assumes that the elements can exhibit the C distribution regardless of their size.

In view of the above, uniformity in coercive force He can be achieved if unit elements of magnetic devices can be formed to have a portion topologically identical to the C distribution immediately before the rotation of the magnetization.

The shape of the element that achieves the above-described objects is not limited to the semi-elliptic shape described above. Examples of other shapes are illustrated in FIGS. 18A to 18H. Each of FIGS. 18A to 18H illustrates an outline of an element when viewed from a direction perpendicular to the plane that includes the easy axis and the hard axis.

Figure 18A:
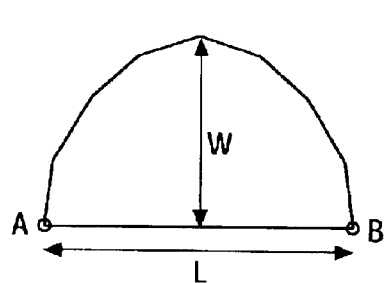
FIG. 18A to 18H show example outlines of semi-elliptic elements.
Figure 18B:
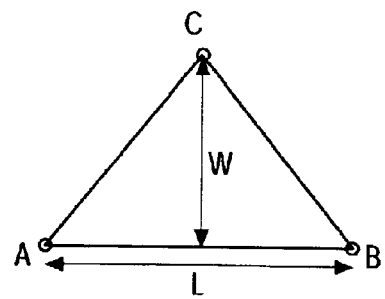
Figure 18C:
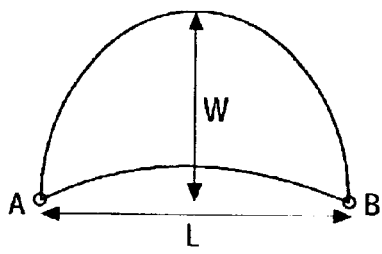
Figure 18D:
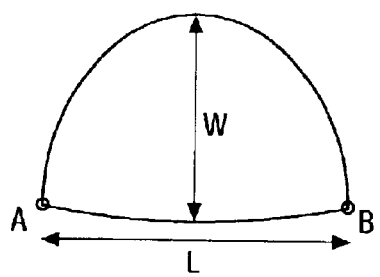
Figure 18E:
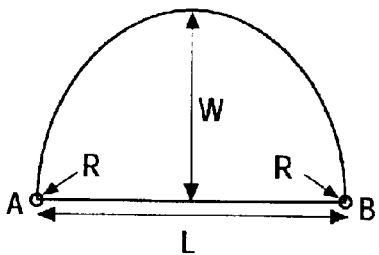
Figure 18F:
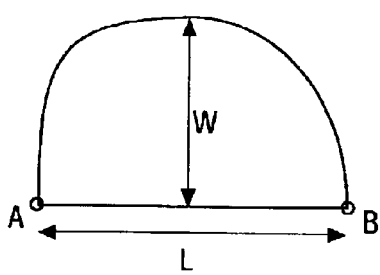
Figure 18G:
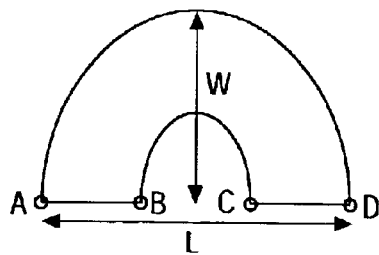
Figure 18H:
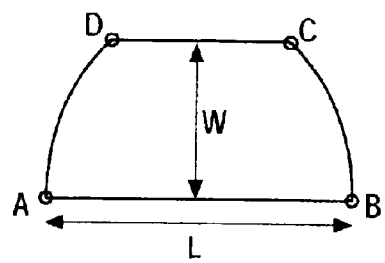

FIG. 18A shows an outline having an arc portion comprising a plurality of straight line segments obtained by a polygonal approximation of an arc. FIG. 18B shows a triangular outline formed by connecting three apexes with straight line segments. FIG. 18C shows an outline consisting of an arc portion and an inwardly curved portion. FIG. 18D shows an outline consisting of an arc portion and an outwardly curved portion. FIG. 18E shows an outline having two rounded apexes. FIG. 18F shows an outline which is not symmetrical. FIG. 18G shows an outline having two arc portions. FIG. 18H shows an outline formed by replacing part of an arc portion with a straight line segment.

In each of the drawing, reference characters A to D denote apexes, and arrows R indicate that the pointed sections are being rounded.

The outline shown in FIG. 18A consists of a straight line AB and a set of straight line segments obtained by a polygonal approximation of an arc AB.

The outline shown in FIG. 18B is triangular and formed by connecting three apexes A, B, and C with straight lines. The number of apexes is not limited to three, and can be increased to form complex polygonal shapes.

The outline shown in FIG. 18C has no straight segment between the point A and the point B. The outline consists of an arc and an inwardly curved segment. The area of this shape is smaller than that of the semi-elliptic shape. The outline shown in FIG. 18D consists of an arc and an outwardly curved segment. The area of this shape is larger than that of the semi-elliptic shape.

The outline shown in FIG. 18E has rounded apexes A and B. Each of these apexes is either constituted from at least one curved line or from a plurality of straight line segments obtained by a polygonal approximation.

The outline shown in FIG. 18F is asymmetrical with respect to an axis perpendicular to the straight line segment AB, i.e., an axis in the direction indicated by the double headed arrow W. The term "asymmetrical" means that the outline does not have line or plane symmetry.

The outline shown in FIG. 18G consists of two elliptic arcs AD and BC and two straight line segments AB and CD. The arc AD is larger than the arc BC. This outline clearly resembles the shape of letter C. Alternatively, the outline may include a combination of more than two arcs.

The outline shown in FIG. 18H consists of an arc AD, an arc BC, a straight line segment AB, and a straight line segment DC. The shape resembles a partly cut-away semi-ellipse.

Note that all the outlines shown in FIGS. 18A to 18H can be transformed into one another without having to form a new hole, i.e., they are topologically identical to one another.

As described above, examples of the shape of the unit element include those having one elliptic arc, as shown in FIGS. 18C to 18F, and those having more than two elliptic arcs, as shown in FIGS. 18G and 18H. The arc may be entirely subjected to a polygonal approximation so as to be constituted from a plurality of straight line segments, as shown in FIG. 18A. Alternatively, the arc may be partly subjected to a polygonal approximation or a linear approximation so that part of the arc is replaced with a straight line segment, as shown in FIG. 18H. The shape of element may be constituted from straight line segments connecting between three or more apexes, as shown in FIG. 18B. Moreover, the shape of the element may be constituted from an elliptic arc and an inwardly or outwardly curved line segment, as shown in FIGS. 18C and 18D. The apexes may be rounded, as shown in FIG. 18E, or may be pointed.

The outline is selected according to various factors such as the manufacturing process of elements or the photomask accuracy. However, unnecessarily complicated shape should be avoided considering the efficiency of improving the coercive force or the like, the manufacturing cost, and prevention of an increase in the number of manufacturing steps.

Figure 19I:
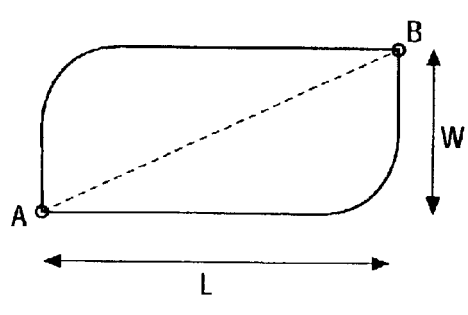
FIG. 19I to 19N show other example outlines of semi-elliptic elements.
Figure 19J:
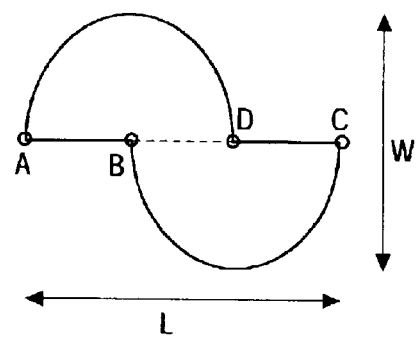

Other examples of outlines that include a letter-C shape or a letter-S shape are shown in FIGS. 19I to 19N. The shapes shown in FIGS. 19I and 19J each consist of a plurality of semi-ellipses or approximated semi-ellipses. The outline shown in FIG. 19I is a combination of two semi-ellipses or approximated semi-ellipses that are arranged to face each other. The two parts divided by the dotted line AB are not symmetrical with respect to the dotted line AB. The outline shown in FIG. 19J is a combination of two semi-ellipses or approximated semi-ellipses that are displaced in the horizontal direction in the drawing. The shape shown in FIG. 19J includes straight line segments AB and DC, and elliptic arcs AD and BC.

Figure 19K:
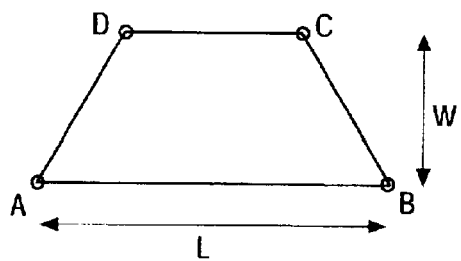
Figure 19L:
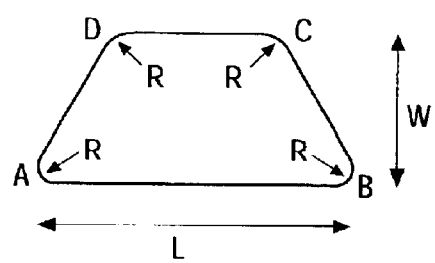
Figure 19M:
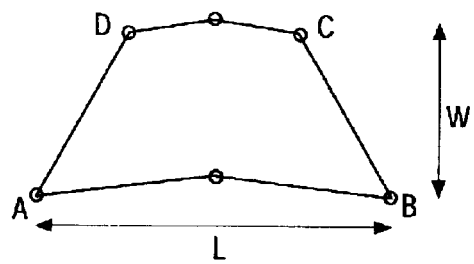
Figure 19N:
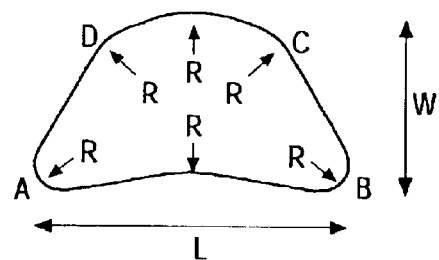

As shown in FIGS. 19K to 19N, the shape of the element may be trapezoidal or derived from a trapezoid. The shape shown in FIG. 19K is trapezoidal and includes an upper side AB and a lower side DC. The shape in 19L is trapezoidal but with rounded apexes A to D. In the shape shown in FIG. 19M, each of the upper side and the lower side of a trapezoid is chevron-shaped. In the shape shown in FIG. 19N, corners of the shape shown in FIG. 19M are rounded. The outlines in FIGS. 19K to 19N are examples consisting of segments connecting between four or more of apexes. The corners of the shapes shown in FIGS. 19L and 19N are rounded.

Figure 20:
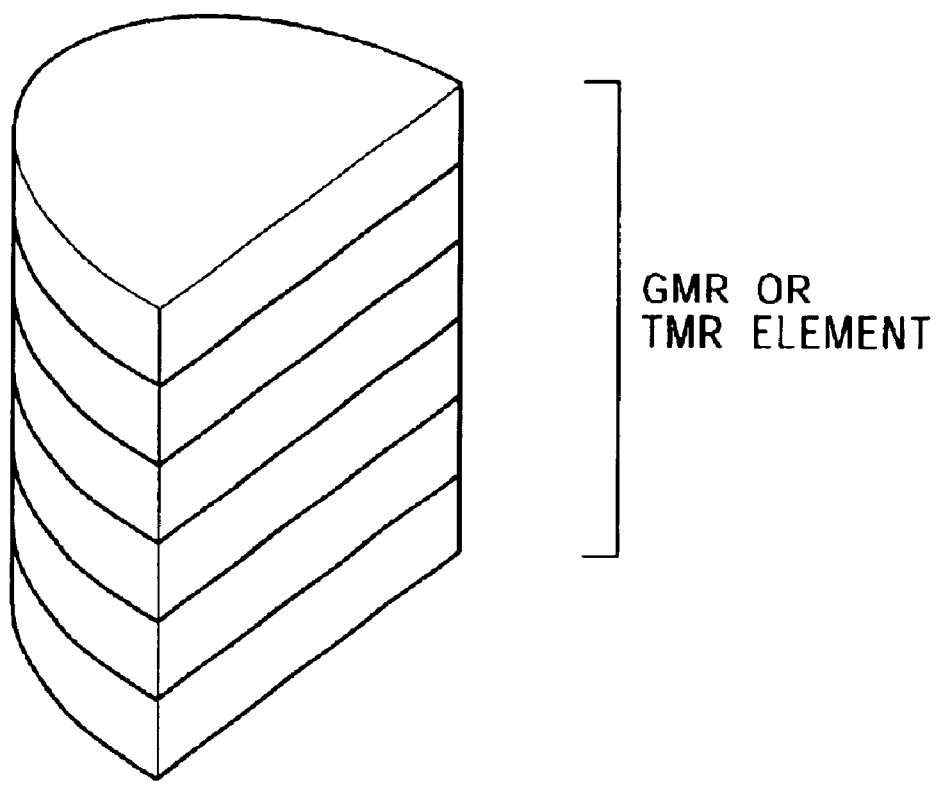
FIG. 20 is a schematic view showing the outline of an element.

FIG. 20 shows an example of a giant magnetoresistive (GMR) element or a tunneling magnetoresistive (TMR) element having an outline partly topologically identical to the C (or S) distribution. The element shown in FIG. 20 may be used as a unit element such as a memory element or a read element.

Figure 5:
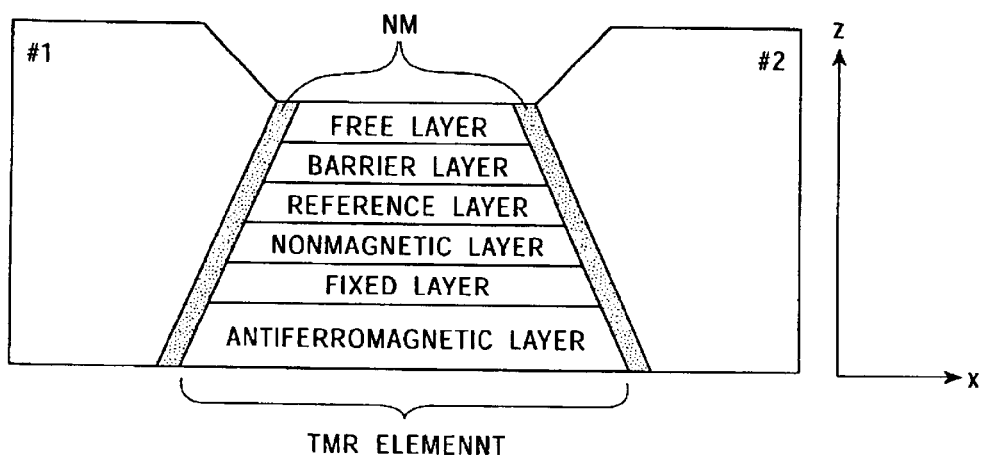
FIG. 5 is a schematic view showing the structure of a read element using a TMR element.

The structure of the element may include a free layer, a fixed layer, and an antiferromagnetic layer, stacked in that order or in the reversed order, as shown in FIGS. 2 and 5. The position of the free layer is not limited to the top of the stack.

FIGS. 21 to 24 are cross-sectional views showing example structures of elements.

Figure 21:
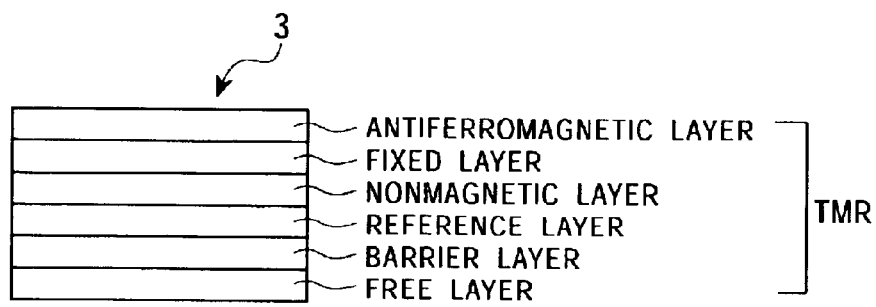
FIG. 21 shows an example structure of a TMR element having a free layer at the bottom.

FIG. 21 shows a tunneling magnetoresistive element 3. The tunneling magnetoresistive element 3 includes a free layer, which is the bottommost layer, a barrier layer, a reference layer, a nonmagnetic layer, a fixed layer, and an antiferromagnetic layer, stacked in that order.

Figure 22:
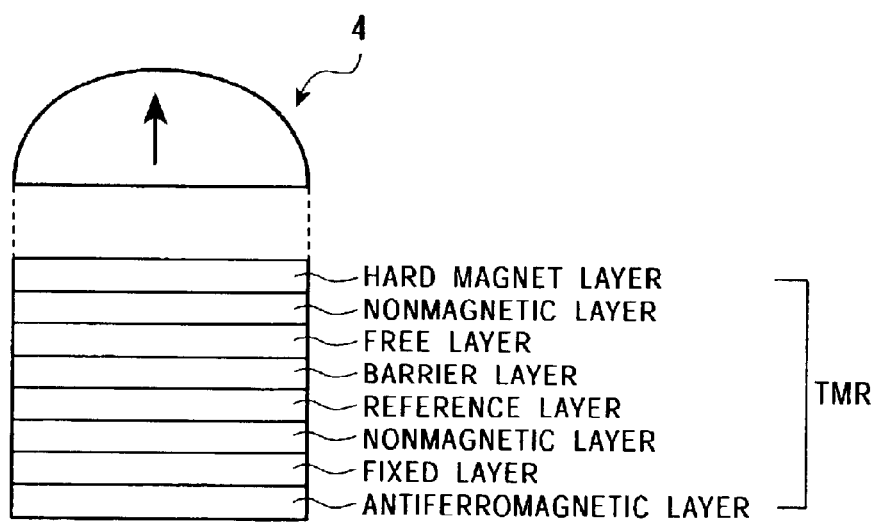
FIG. 22 shows an example structure of a TMR element including a hard magnet layer for controlling the magnetic domains.

FIG. 22 shows a tunneling magnetoresistive element 4 including a hard magnet layer. In the drawing, the shape of the hard magnet layer as viewed from above and the magnetization direction of thereof are indicated by the bold arrow.

In this example, the hard magnet film or layer is disposed at the top. The tunneling magnetoresistive element 4 includes an antiferromagnetic layer, a fixed layer, a nonmagnetic layer, a reference layer, a barrier layer, a free layer, a nonmagnetic layer, and a hard magnet layer, stacked in that order.

The hard magnet layer is provided so as to induce biasing magnetic field that promotes the C distribution of magnetization.

Figure 23:
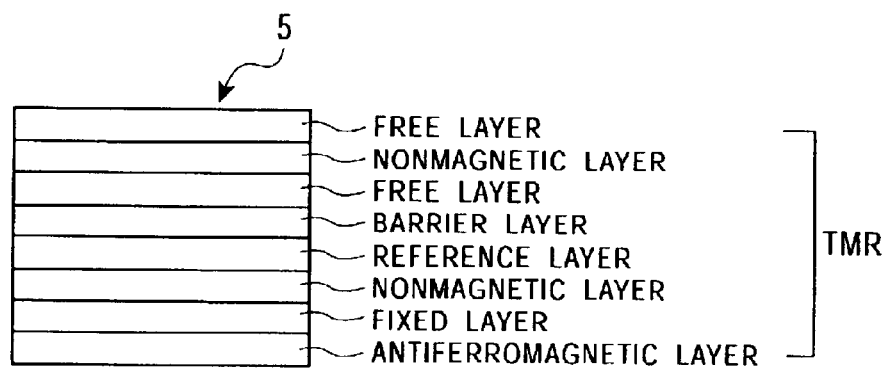
FIG. 23 shows an example structure of a TMR element including a plurality of free layers.

FIG. 23 shows a tunneling magnetoresistive element 5 having two free layers. The tunneling magnetoresistive element 5 includes an antiferromagnetic layer, a fixed layer, a nonmagnetic layer (lower nonmagnetic layer), a reference layer, a barrier layer, a free layer (lower free layer), a nonmagnetic layer (upper nonmagnetic layer), and a free layer (upper free layer), stacked in that order. The antiferromagnetic layer is the bottommost layer.

The tunneling magnetoresistive element 5 may include more than two free layers.

Figure 24:
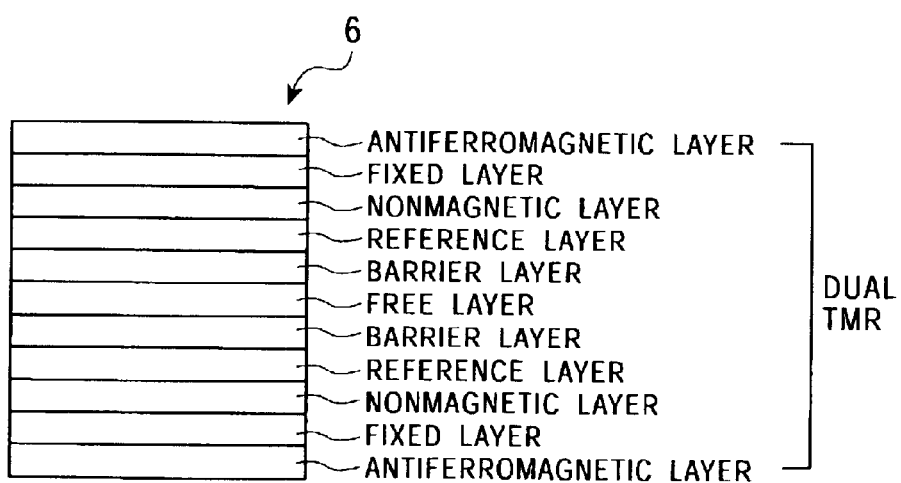
FIG. 24 shows an example structure of a TMR element including a plurality of barrier layers and an antiferromagnetic layer.

FIG. 24 shows a dual tunneling magnetoresistive element 6. The dual tunneling magnetoresistive element 6 includes two layers of nonmagnetic films (barrier layers) that mostly produce the TMR effect.

The dual tunneling magnetoresistive element 6 basically includes a structure comprising an antiferromagnetic layer (second antiferromagnetic layer), a fixed layer (first fixed layer), a free layer, a fixed layer (second fixed layer), and an antiferromagnetic layer (second antiferromagnetic layer). The layer structure of the element 6 shown in FIG. 24 shows symmetry with respect to the free layer at the middle. In other words, a barrier layer, a reference layer, a nonmagnetic layer, a fixed layer, and an antiferromagnetic layer are deposited on the free layer in that order. Another barrier layer, another reference layer, another nonmagnetic layer, another fixed layer, and another antiferromagnetic film are disposed under the free layer in that order when viewed from the free-layer side. Such a dual structure increases the magnetic resistance ratio and improves the electrical sensitivity of the element, namely, a memory element or a read element. Thus, if applied to a memory element, the error rate can be decreased, and, if applied to a read element, an increase in the output voltage can be expected.

Although the tunneling magnetoresistive element 6 has two barrier layers, as shown in the drawing, the number of the barrier layer can be more than two.

Note that although examples of TMR elements are shown in FIGS. 21 to 24, these structures can be applied to the basic structures of GMR elements. The difference is, for example, absence of the barrier layer in the GMR element. For example, a GMR element having a structure corresponding to that shown in FIG. 24 includes two or more nonmagnetic films that mostly produce the GMR effect.

In the example elements described above, the free layer is constituted from a ferromagnetic film. Each of the above-described elements, i.e., unit elements, having a multilayer structure is used as a memory element shown in FIG. 21 or as a read element shown in FIG. 24.

The above-described advantages of forming a ferromagnetic member to be topologically identical to the C distribution of magnetization can be achieved not only in magnetic memory elements or read elements but also in various other recording media formed by thin-film deposition or application of magnetic particles onto a disk (hard or flexible), a tape, a card, a paper, or the like. In other words, the present invention can be applied to a continuous medium, as described below.

Figure 25:
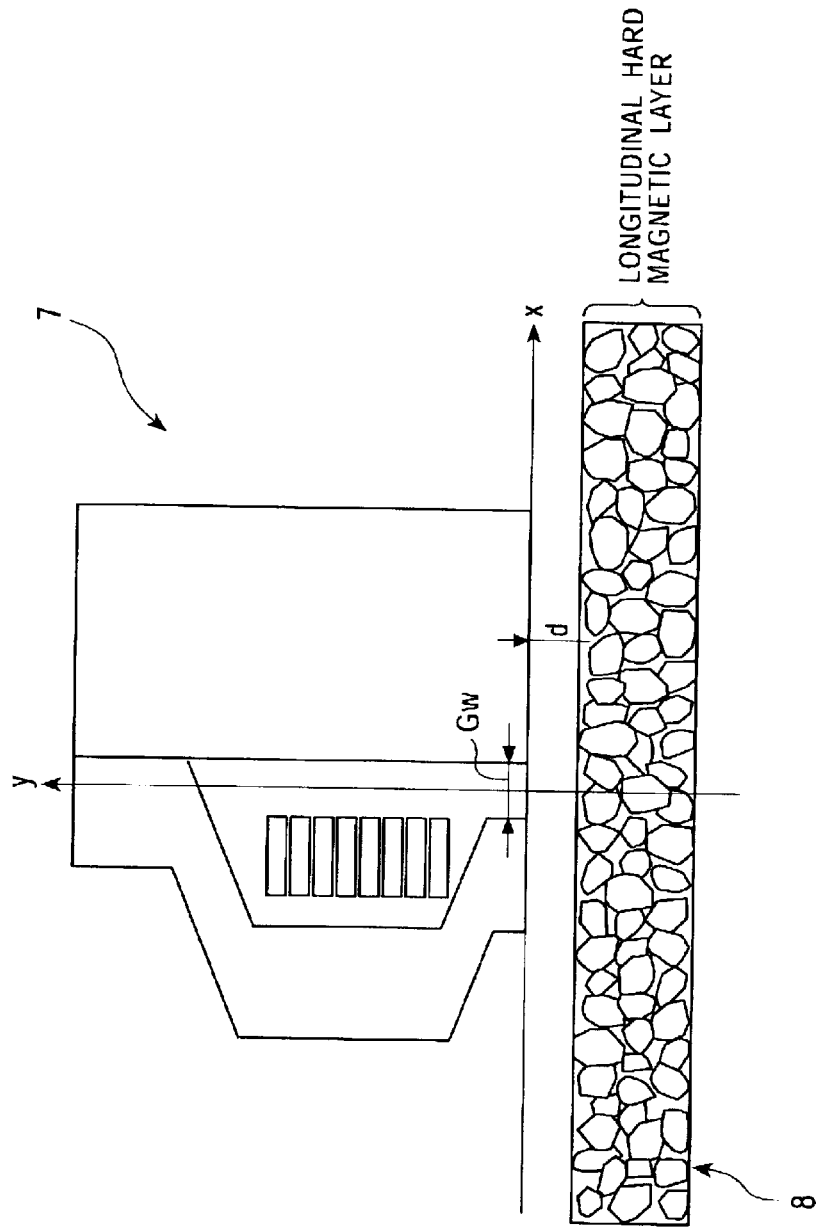
FIG. 25 is a schematic cross-sectional view for explaining a known longitudinal magnetic recording medium.
Figure 26:
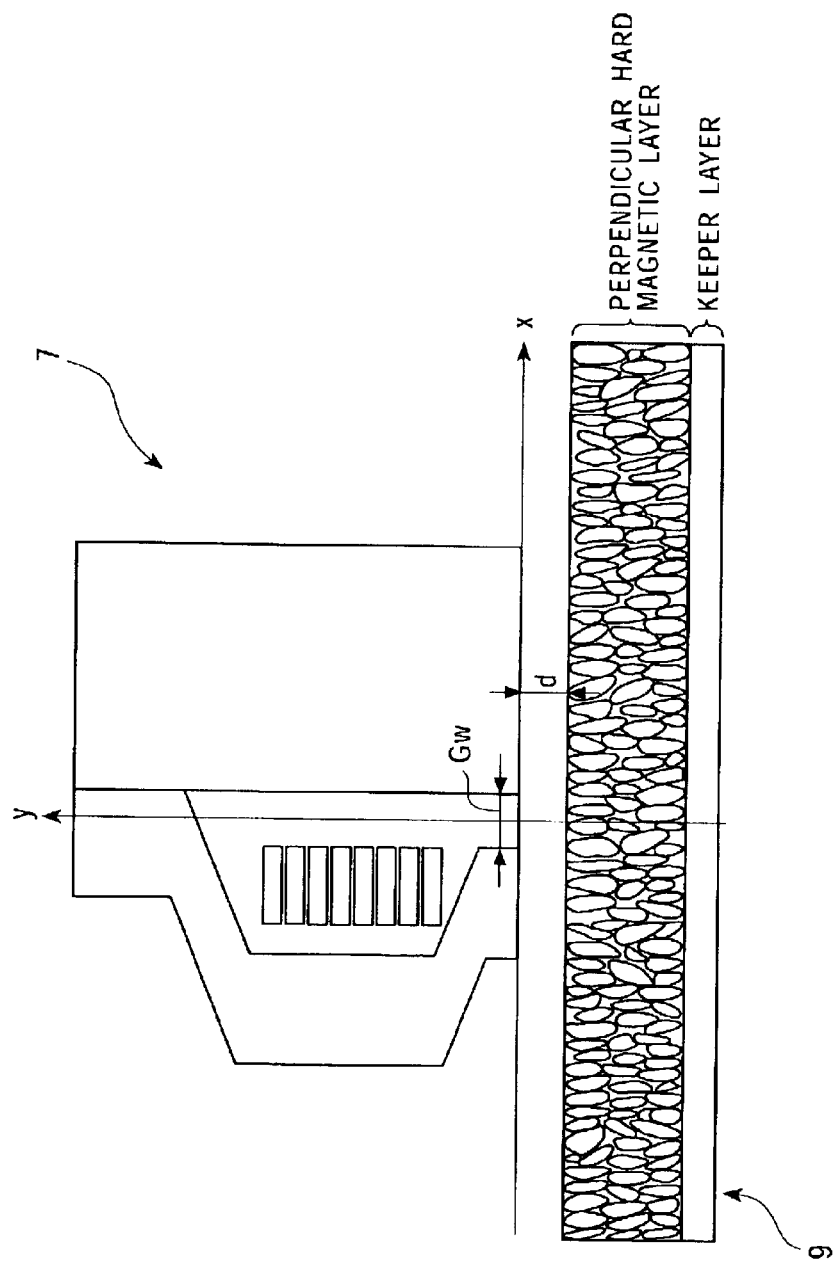
FIG. 26 is a schematic cross-sectional view for explaining a known perpendicular magnetic recording medium.

FIGS. 25 and 26 show a write head 7 and known recording media 8 and 9. FIG. 25 shows an example of a longitudinal medium, and FIG. 26 shows an example of a perpendicular medium. In the drawings, the x axis indicates the moving direction of the write head 7 relative to the recording media 8 and 9, i.e., the horizontal direction in the drawing. The y axis is orthogonal to the x axis. Reference character Gw represents a recording gap length, and d represents the distance between the head and the medium. Rectangles inside the write head 7 represent conductors for excitation.

Figure 29:
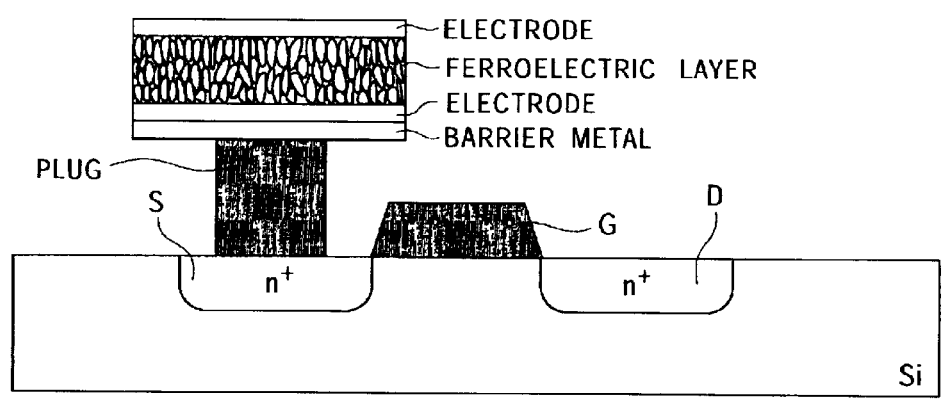
FIG. 29 is a schematic cross-sectional view for describing the structure of a known memory device using a ferroelectric film in a memory cell.

Because the recording medium 8 in FIG. 25 is a longitudinal medium, the magnetization direction thereof is oriented in the x axis direction after recording, i.e., the direction of the recording magnetization is the x axis direction. The recording medium 9 includes a ferromagnetic layer formed on a keeper layer, as shown in FIG. 29, and is thus a perpendicular medium. The magnetization direction thereof is oriented in the y axis direction after recording, i.e., the direction of the recording magnetization is the y axis direction.

The magnetic layers of known media have been constituted from granular, columnar, or spicular magnetic particles. However, in the present invention, the magnetic particles are formed to be partially topologically identical to the shape of letter C or S which resembles the magnetization distribution immediately before the rotation of magnetization. A magnetic recording medium of the present invention has a ferromagnetic layer constituted from such magnetic particles. Thus, the coercive force can be made substantially uniform, and transitional noise generated from magnetization transition portions can be reduced.

Figure 27:
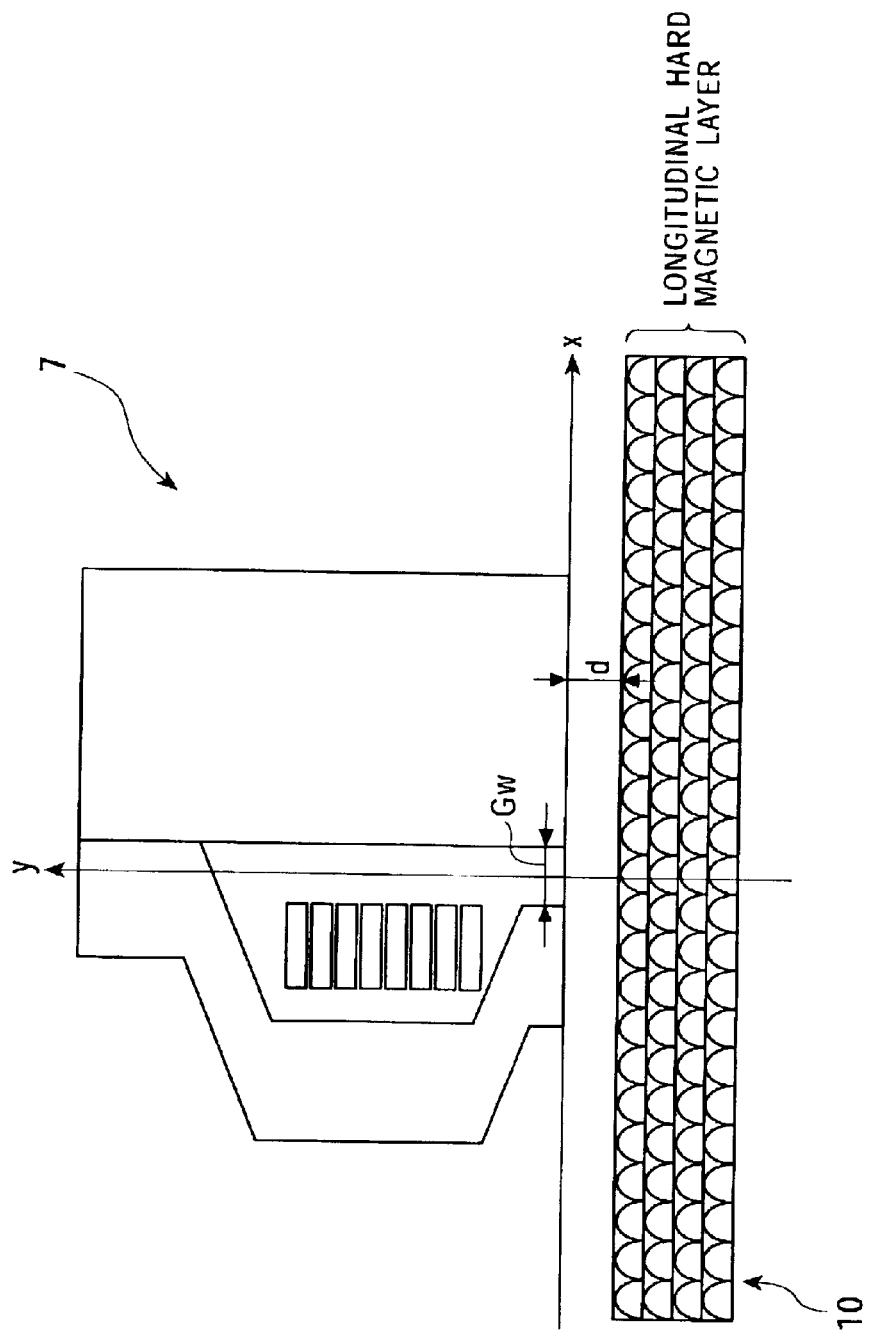
FIG. 27 is a schematic cross-sectional view for explaining a longitudinal magnetic recording medium of the present invention formed by ferromagnetic particles having a semi-elliptical cross section.
Figure 28:
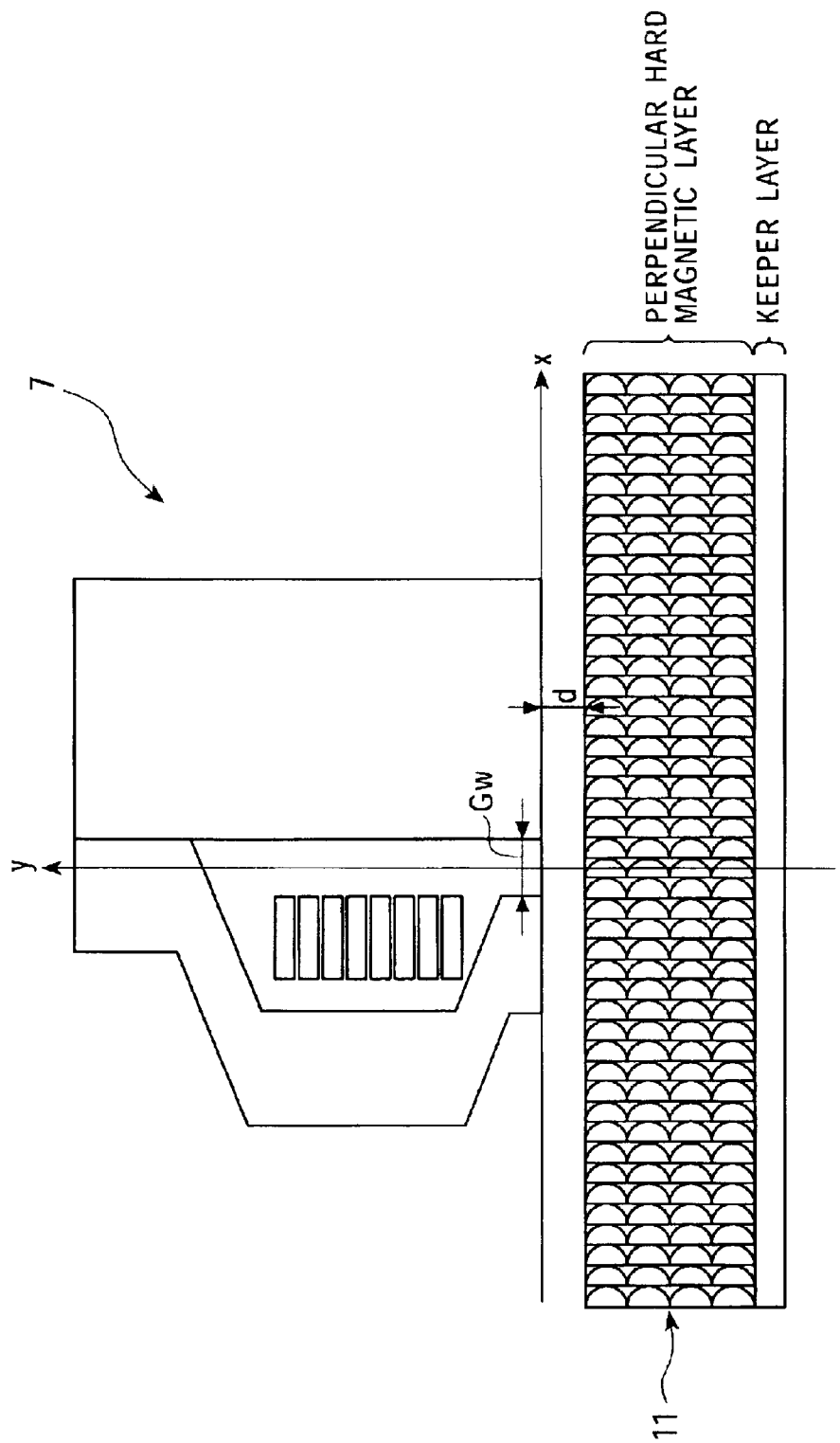
FIG. 28 is a schematic cross-sectional view for explaining a perpendicular magnetic recording medium of the present invention formed by ferromagnetic particles having a semi-elliptical cross section.

FIGS. 27 and 28 show the recording head 7 and magnetic recording media 10 and 11 made of the magnetic particles of the present invention. The arrangement of the x and y axes and the definition of reference characters Gw and d are the same as those in FIGS. 25 and 26.

The magnetic recording medium 10 shown in FIG. 27 is a longitudinal medium. The easy axis of the magnetic particles is arranged in the longitudinal direction. The cross-sections of the magnetic particles are substantially semi-elliptic and the particles are aligned in the x axis direction. In other words, a large number of magnetic particles having C-shaped elliptic arcs are self-aligned in the direction of the easy axis, and the straight line segments of the magnetic particles are regularly aligned in the longitudinal direction. Although a four-layer structure is depicted in the drawing, no limit is imposed as to the number of layers.

The magnetic recording medium 11 shown in FIG. 28 is a perpendicular medium. The easy axis of the magnetic particles is aligned perpendicular to a base face of the magnetic recording medium. The cross-sections of the magnetic particles are substantially semi-elliptic and are aligned in the y axis direction. In the magnetic recording medium 11, a ferromagnetic layer is formed on a keeper layer, and a large number of magnetic particles having C-shaped elliptic arcs are self-aligned in the easy axis direction, i.e., the y axis direction in the drawing, so that the straight line segments of the magnetic particles are regularly aligned in the perpendicular direction. Here, the base face is the interface between the keeper layer and the ferromagnetic layer. Alternatively, the element may have no keeper layer.

Another example of the magnetic recording medium is an oblique medium. In an oblique medium, the easy axis of the magnetic particles is distributed diagonally. The oblique medium can be suitably used in a helical-scan-type recording tape or the like.

As for the three-dimensional shape of the magnetic particles, the magnetic particles may be of a shape obtained by rotating a semi-ellipse about a longitudinal axis orthogonal to the straight line segment of the semi-ellipse, i.e., part of the shape of a circular convex lens. Alternatively, as shown in FIG. 20, the magnetic particles may be of a shape obtained by moving a semi-ellipse in the direction orthogonal or diagonal to the plane of the semi-ellipse. As for the two-dimensional shape of the magnetic particles, various shapes such as those shown in FIGS. 18A to 19N may be employed.

Lastly, a ferroelectric device including a unit element, namely, a memory element or a capacitative element, using a ferroelectric film will now be described. Examples of the ferroelectric device include ferroelectric memory devices and the like.

FIG. 29 shows an example structure of a known memory element having a ferroelectric film.

A ferroelectric film or layer is disposed between two parallel electrodes opposing each other. One of the electrodes is connected to a field effect transistor (FET) via a plug. The FET is a MOSFET formed in a silicon substrate and includes a source S, a drain D, and a gate G.

The polarization of the ferroelectric film induces a depolarization field. Since the distribution of the depolarization field is not uniform, the domain structure of the ferroelectric film becomes complex. Such domain structure can be controlled by forming a ferroelectric member to be topologically identical to the letter-C or letter S shape corresponding to the polarization distribution immediately before the rotation of the polarization. As a result, the coercive field Ec, at which the polarization rotates, can be made uniform.

Figure 30:
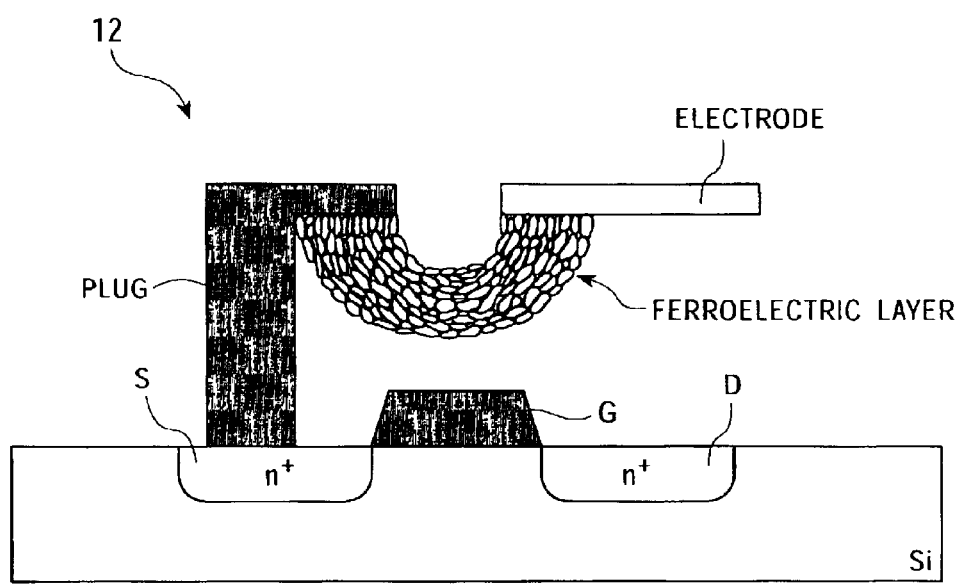
FIG. 30 shows the structure of a memory device using a ferroelectric film of the present invention in a memory cell, the ferroelectric film being disposed above a logic circuit.

FIG. 30 is a cross-sectional view of a ferroelectric device 12 disposed above a logic circuit.

As shown in FIG. 30, the ferroelectric layer is curved into a letter-C shape, which corresponds to the shape shown in FIG. 18G. A first end of the ferroelectric layer is connected to an electrode, and a second end thereof is connected to a source S of a MOSFET via a plug. The MOSFET is formed in a silicon substrate and constitutes part of the logic circuit. The ferroelectric layer has the shape of letter C when viewed from the side, i.e., the direction orthogonal to the plane that includes the axis of the polarization direction whereas a unit element of a magnetic device has a portion having the shape of letter C when viewed from above, i.e., the direction orthogonal to the plane of the element.

Figure 31:
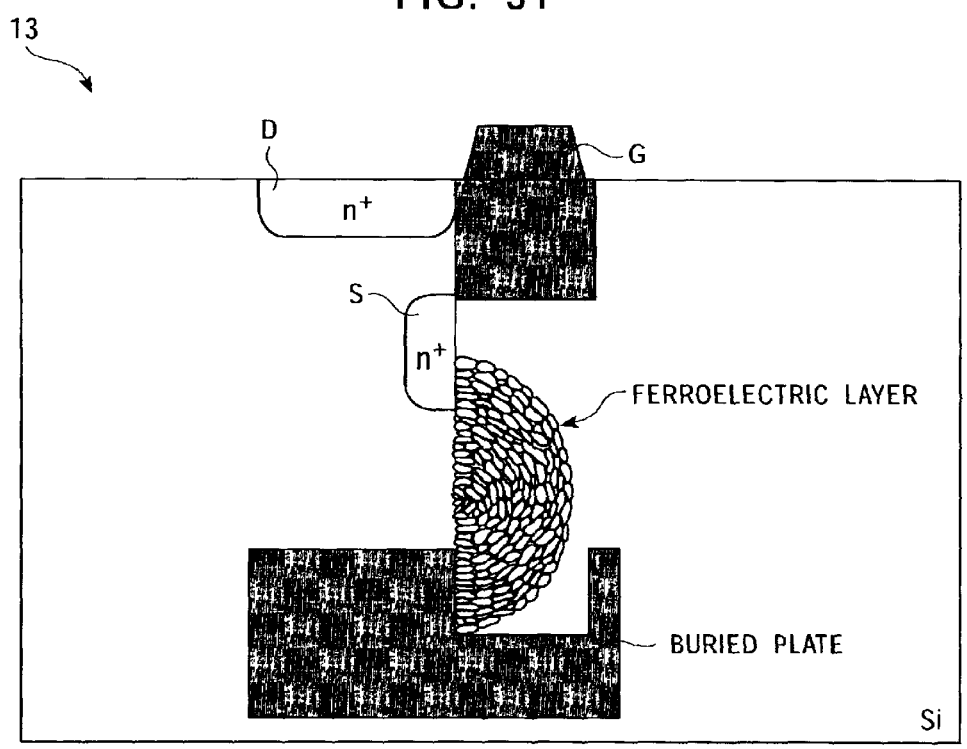
FIG. 31 is a schematic cross-sectional view of a memory device using a ferromagnetic film of the present invention in a memory cell, the semi-elliptic ferroelectric film being disposed inside a trench.

FIG. 31 shows a ferroelectric device 13 having a ferroelectric capacitative element (unit element) disposed inside a trench. The ferroelectric device 13 is rarely affected by disturbance.

In the ferroelectric device 13, a ferroelectric film is semi-elliptic, and a first end is connected to a buried plate, and a second end is connected to a source S of a MOSFET. The FET has the same function as that of FIG. 30.

The coercive field Ec can be made uniform by forming the ferroelectric film to have an elliptic arc portion corresponding to the letter-C shape. As a result, the electrical potential for rotation of the polarization applied to the electrode can be made uniform, the variation in characteristics can be decreased, and the defect rate can be decreased. Since the domain structure can be made uniform, a ferroelectric memory element highly resistant to write fatigue can be obtained.

Note that the shape of the ferroelectric film viewed from the side is not limited to those shown in FIGS. 30 and 31. The shapes shown in FIGS. 18A to 19N can also be employed.

When the present invention is applied to magnetic devices such as magnetic memory elements, for example, the number of defective memory cells can be decreased since the coercive force necessary for rewriting the information of a magnetic memory element can be made uniform. Thus, the capacity of magnetic random access memories can be increased, the price thereof can be reduced, and the area of a chip can be decreased while improving the reliability. Moreover, the biasing magnetic field that allows a read element to exhibit linear response can be decreased. As a result, the sensitivity and the reliability of the magnetic read head can be improved, and the head can be used in association with higher-density recording media. When the present invention is applied to a magnetic medium formed of micro magnetic particles, the transitional noise can be reduced since the coercive force can be made uniform. Thus, the linear recording density can be improved, and the transmitting rate can be increased.

When the present invention is applied to ferroeletric devices such as ferroelectric memory cells, for example, the depolarization field necessary for rewriting the information on the ferroelectric memory elements can be made uniform, and the number of defective memory cells can be reduced. Thus, the capacity of ferroelectric memories can be increased, the price thereof can be reduced, and the area of a chip can be decreased while improving the reliability.

What is claimed is:

1. A magnetic device comprising a unit element comprising at least one ferromagnetic film,
    wherein an outline of the unit element ferromagnetic film is generally a letter-C shape or a letter-S shape corresponding to a magnetization distribution immediately before rotation of magnetization, the unit element comprising at least two ferromagnetic films functioning as free layers.

2. The magnetic device according to claim 1, wherein the unit element is one of a memory element, a magnetic sensing element, and a read element.

3. The magnetic device according to claim 2, wherein the unit element is one of a giant magnetoresistive element and a tunneling magnetoresistive element.

4. The magnetic device according to claim 1, wherein the unit element is one of a giant magnetoresistive element and a tunneling magnetoresistive element.

5. The magnetic device according to claim 1, wherein the unit element has a multilayer structure comprising the ferromagnetic film functioning as a free layer, a fixed layer, and an antiferromagnetic layer, which are stacked in that order or in the reversed order.

6. The magnetic device according to claim 1, the unit element further comprising a hard magnet layer.

7. The magnetic device according to claim 1, wherein the outline of the unit element includes one of:
    at least one elliptic arc;
    a set of straight line segments or a straight line segment obtained by a polygonal approximation of an elliptic arc or
    a part of an elliptic arc; and
    a set of straight line segments connecting three or more apexes.

8. The magnetic device according to claim 7, wherein the unit element has a semi-elliptic shape having the outline consisting of: an arc or an approximated arc; and an inwardly or outwardly curved segment.

9. The magnetic device according to claim 7, wherein the unit element has rounded apexes rounded by a curve or polygonal approximation.

10. The magnetic device according to claim 7, wherein the outline of the unit element includes a plurality of semi-ellipses or approximated semi-ellipses opposing each other or being displaced from each other.

11. A magnetic device comprising a unit element comprising at least one ferromagnetic film,
    wherein an outline of the unit element ferromagnetic film is generally a letter-C shape or a letter-S shape corresponding to a magnetization distribution immediately before rotation of magnetization,
    wherein the unit element is a dual giant magnetoresistive element or a dual tunneling magnetoresistive element having a multilayer structure comprising a first antiferromagnetic layer, a first fixed layer, the ferromagnetic film functioning as a free layer, a second fixed layer, and a second antiferromagnetic layer, the layers being stacked in that order.

* * * * *